United States Patent
Kim et al.

(10) Patent No.: US 11,328,966 B2
(45) Date of Patent: May 10, 2022

(54) CHIP-STACKED SEMICONDUCTOR PACKAGE AND METHOD OF MANUFACTURING SAME

(71) Applicant: SAMSUNG ELECTRONICS CO., LTD., Suwon-si (KR)

(72) Inventors: Hyoeun Kim, Cheonan-si (KR); Yonghoe Cho, Bucheon-si (KR); Sunkyoung Seo, Cheonan-si (KR); Seunghoon Yeon, Suwon-si (KR); Sanguk Han, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 192 days.

(21) Appl. No.: 16/749,620

(22) Filed: Jan. 22, 2020

(65) Prior Publication Data
US 2020/0411393 A1    Dec. 31, 2020

(30) Foreign Application Priority Data

Jun. 25, 2019    (KR) .................... 10-2019-0075789

(51) Int. Cl.
| | |
|---|---|
| *H01L 21/66* | (2006.01) |
| *H01L 25/065* | (2006.01) |
| *H01L 23/31* | (2006.01) |
| *H01L 25/00* | (2006.01) |
| *H01L 23/00* | (2006.01) |
| *G01R 31/28* | (2006.01) |
| *G01R 27/26* | (2006.01) |

(52) U.S. Cl.
CPC .......... *H01L 22/32* (2013.01); *G01R 27/2605* (2013.01); *G01R 31/2818* (2013.01); *H01L 22/14* (2013.01); *H01L 23/3128* (2013.01); *H01L 24/94* (2013.01); *H01L 25/0657* (2013.01); *H01L 25/50* (2013.01); *H01L 2225/06513* (2013.01)

(58) Field of Classification Search
CPC ......... H01L 22/32; H01L 25/50; H01L 22/34; H01L 22/14; H01L 23/3218; H01L 25/0657; H01L 24/94; G01R 27/2605
USPC ........................... 257/48; 438/11, 14, 15, 18
See application file for complete search history.

(56) References Cited

U.S. PATENT DOCUMENTS

| | | | |
|---|---|---|---|
| 7,649,376 B2 | 1/2010 | Tsuchiya | |
| 8,237,450 B2 | 8/2012 | Nagasaki | |
| 8,963,150 B2 | 2/2015 | Yeo et al. | |
| 9,082,708 B2 | 7/2015 | Zenbutsu | |
| (Continued) | | | |

FOREIGN PATENT DOCUMENTS

KR    10-1320934 B1    10/2013

*Primary Examiner* — Thinh T Nguyen
(74) *Attorney, Agent, or Firm* — Sughrue Mion, PLLC

(57) ABSTRACT

A chip-stacked semiconductor package includes a first chip including a first detection pad and a second detection pad; a second chip provided on the first chip, the second chip including a third detection pad facing the first detection pad and a fourth detection pad facing the second detection pad; and a first medium provided between the first detection pad and the third detection pad to connect the first detection pad to the third detection pad through the first medium, and a second medium, different from the first medium, provided between the second detection pad and the fourth detection pad to connect the second detection pad to the fourth detection pad through the second medium.

20 Claims, 30 Drawing Sheets

(56) References Cited

U.S. PATENT DOCUMENTS

| | | |
|---|---|---|
| 9,093,412 B2 | 7/2015 | Sun et al. |
| 9,874,603 B2 | 1/2018 | Farr et al. |
| 10,056,354 B2 | 8/2018 | Kim |
| 2005/0248011 A1 | 11/2005 | Jung et al. |
| 2018/0277514 A1* | 9/2018 | Iwamoto ............ H01L 25/0657 |

* cited by examiner

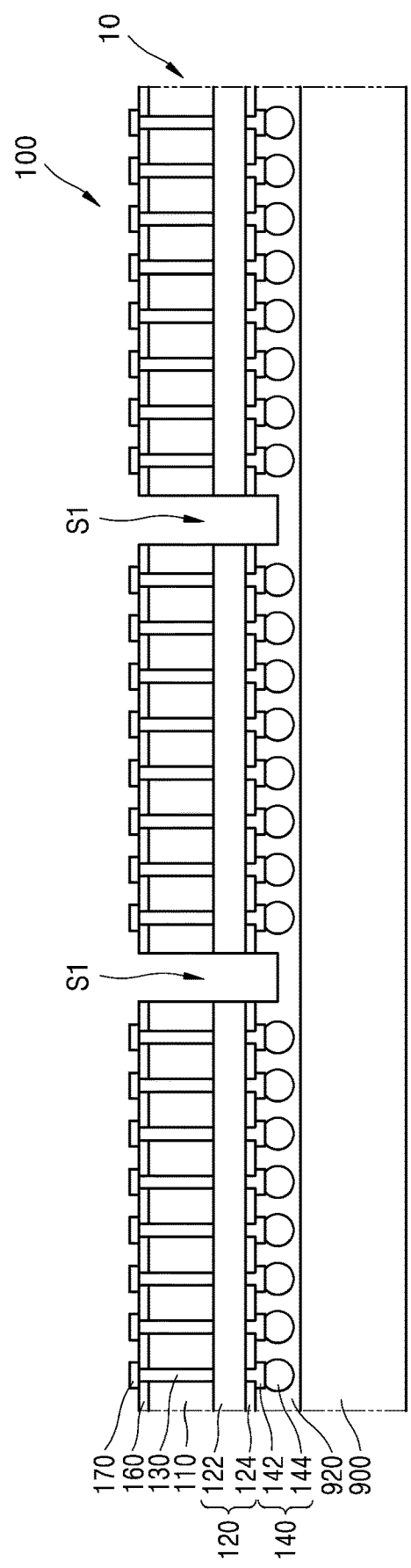

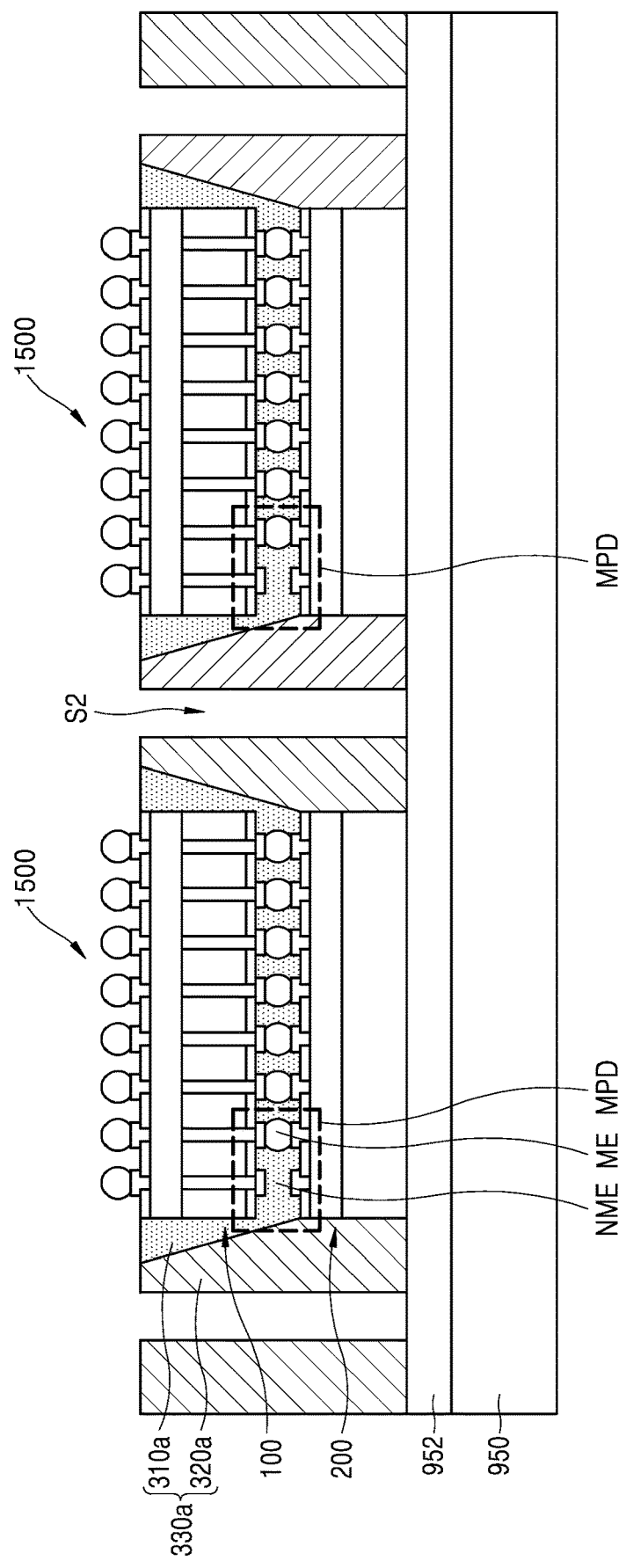

CHIP-STACKED SEMICONDUCTOR PACKAGE AND METHOD OF MANUFACTURING SAME

CROSS-REFERENCE TO RELATED APPLICATION

This application is based on and claims priority from Korean Patent Application No. 10-2019-0075789, filed on Jun. 25, 2019, in the Korean Intellectual Property Office, the disclosure of which is incorporated herein in its entirety by reference.

BACKGROUND

The inventive concept relates to semiconductor packages and methods of manufacturing the same, and more particularly, to a chip-stacked semiconductor package, and a method of manufacturing the chip-stacked semiconductor package.

Chip-stacked semiconductor packages in which a plurality of chips (semiconductor chips) are stacked in a vertical direction are being used in high-capacity, high-performance, and multi-functional electronic apparatuses. During an in-line process of manufacturing a chip-stacked semiconductor package by stacking a second chip on a first chip, a stacking quality needs to be evaluated by measuring a stacking accuracy between the first chip and the second chip or measuring or detecting a joint gap between the first chip and the second chip. The reliability of chip-stacked semiconductor packages may depend on the stacking quality.

SUMMARY

The inventive concept provides a chip-stacked semiconductor package in which a stacking accuracy between first and second chips or a joint gap between the first and second chips may be detected.

The inventive concept provides a method of manufacturing the aforementioned chip-stacked semiconductor package.

According to an aspect of the disclosure, there is provided a chip-stacked semiconductor package comprising: a first chip comprising a first detection pad and a second detection pad; a second chip provided on the first chip, the second chip comprising a third detection pad facing the first detection pad and a fourth detection pad facing the second detection pad; and a first medium provided between the first detection pad and the third detection pad to connect the first detection pad to the third detection pad through the first medium, and a second medium, different from the first medium, provided between the second detection pad and the fourth detection pad to connect the second detection pad to the fourth detection pad through the second medium.

According to another aspect of the disclosure, there is provided a chip-stacked semiconductor package comprising: a first chip comprising a first detection pad, a second detection pad, a first test terminal and a second test terminal, the first test terminal electrically connected to the first detection pad and the second test terminal electrically connected to the second detection pad; and a second chip provided on the first chip with a gap therebetween and comprising a third detection pad facing the first detection pad and a fourth detection pad facing the second detection pad, wherein the third detection pad overlaps the first detection pad and is connected to the first detection pad through a medium, wherein the fourth detection pad is not connected to the second detection pad through the medium, wherein the fourth detection pad is electrically connected to the third detection pad via a conductive line, and wherein the first test terminal and the second test terminal are configured to measure a capacitance between the second detection pad and the fourth detection pad.

According to another aspect of the disclosure, there is provided a chip-stacked semiconductor package comprising: a first chip comprising first connecting members respectively provided on one surface of each of through silicon vias and electrically connected to the through silicon vias, and first chip pads respectively on another surface of each of the through silicon vias and electrically connected to the through silicon vias; a second chip on the first chip and comprising second connecting members electrically connected to the first chip pads, wherein the second connecting members comprise bumps and second chip pads; and a sealant configured to seal spaces between the second connecting members and the first chip pads between the first chip and the second chip, wherein a first one of the first chip pads forms a first detection pad and a second one of the first chip pads forms a second detection pad, wherein a first one of the second chip pads forms a third detection pad connected to the first detection pad, and a second one of the second chip pads forms a fourth detection pad, wherein the fourth detection pad is not connected to the second detection pad, and wherein the fourth detection pad is electrically connected to the third detection pad via a conductive line.

According to another aspect of the disclosure, there is provided a method of manufacturing a chip-stacked semiconductor package, the method comprising: providing a first chip including a first detection pad, a second detection pad, a first test terminal and a second test terminal, the first test terminal electrically connected to the first detection pad and the second terminal electrically connected to the second detection pad; stacking a second chip on the first chip with a gap therebetween, wherein the second chip includes a third detection pad facing the first detection pad and a fourth detection pad facing the second detection pad; arranging the third detection pad to overlap the first detection pad and connecting the first detection pad with the third detection pad through a first medium; providing a second medium between the fourth detection pad and the second detection pad, the second medium being different from the first medium; and electrically connecting the fourth detection pad to the third detection pad via a conductive line; and measuring a capacitance between the second detection pad and the fourth detection pad by using the first test terminal and the second test terminal.

According to another aspect of the disclosure, there is provided a testing apparatus for testing a chip-stacked semiconductor package including a first chip comprising a first detection pad and a second detection pad, and a second chip stacked on the first chip with a gap therebetween and comprising a third detection pad facing the first detection pad having a first medium therebetween and a fourth detection pad facing the second detection pad having a second medium therebetween, the testing apparatus comprising: a memory storing one or more instructions; and one or more processors configured to execute the one or more instructions to: apply a first voltage to the first detection pad; measure a second voltage at the second detection pad, the second voltage corresponding to the first voltage propagating through the first detection pad, the third detection pad, the fourth detection pad and the second detection pad; and obtain a capacitance between the second detection pad and the fourth detection pad based on the second voltage.

BRIEF DESCRIPTION OF THE DRAWINGS

Exemplary embodiments of the inventive concept will be more clearly understood from the following detailed description taken in conjunction with the accompanying drawings in which:

FIGS. 17A through 17G are cross-sectional views for explaining a method of manufacturing the chip-stacked semiconductor package of FIG. 15.

DETAILED DESCRIPTION OF THE EMBODIMENTS

The inventive concept will now be described more fully with reference to the accompanying drawings, in which exemplary embodiments of the inventive concept are shown. One embodiment may be implemented, or a plurality of embodiments may be combined and implemented. However, the inventive concept is not limited to these embodiments.

In the description herein, terms such as "first" and "second" are used to distinguish members, and are not used to limit the members themselves or to mean a specific order. In addition, a description to be located "on" or "top", "bottom", or "side" of a member means a relative positional relationship, and does not mean a specific case like being in direct contact with the member or further introduction of another member at an interface therebetween.

Moreover, when an element is "coupled to" or "connected to" another element, the one element may be electrically or mechanically directly coupled or connected to the other element or a third element may exist therebetween.

Figure 1:
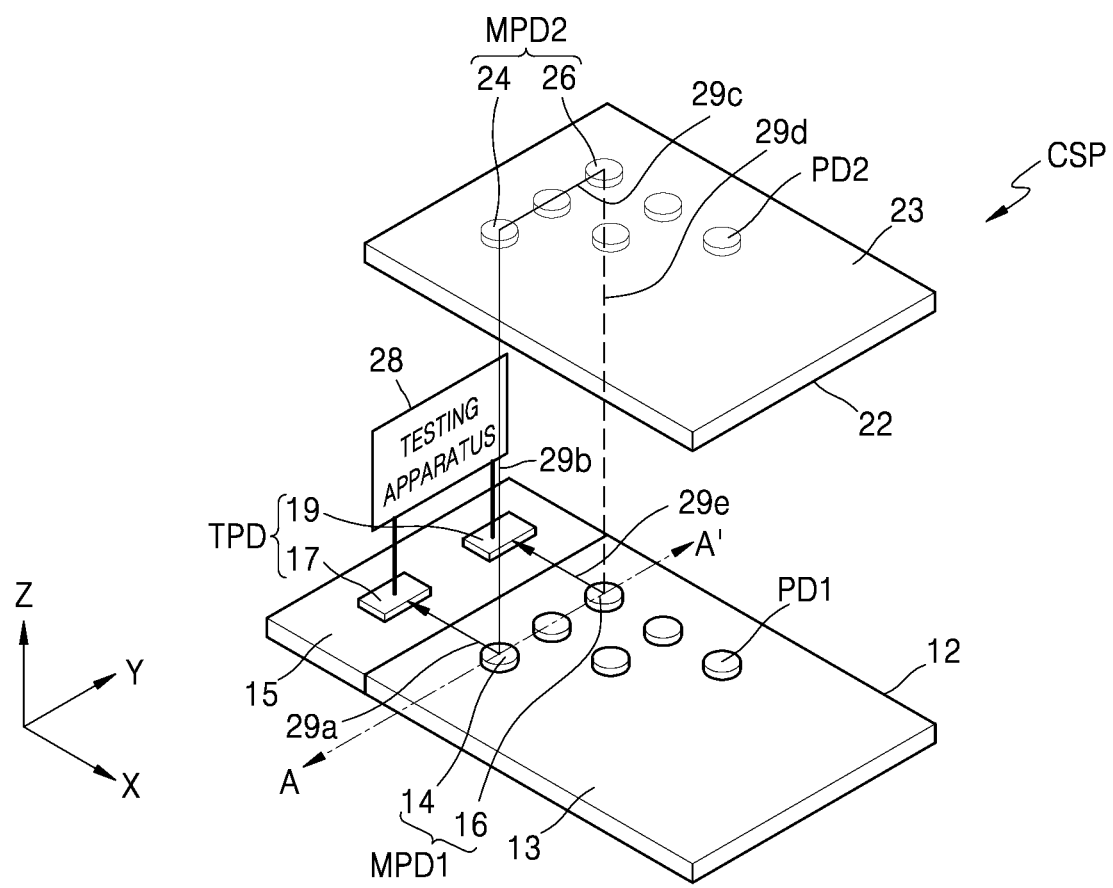
FIGS. 1 and 2 are views for explaining a basic structure of a chip-stacked semiconductor package according to an embodiment of the inventive concept, and a method of detecting a stacking accuracy and a joint gap between chips by using the basic structure.
Figure 2:
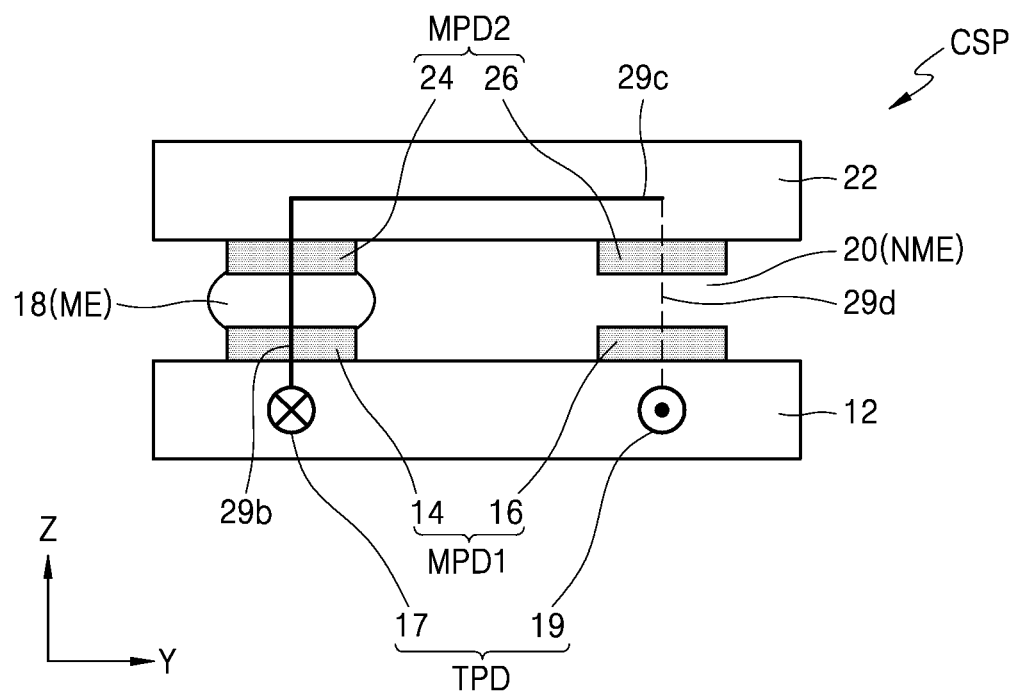

FIGS. 1 and 2 are views for explaining a basic structure of a chip-stacked semiconductor package according to an embodiment of the inventive concept, and a method of detecting a stacking accuracy and a joint gap between chips by using the basic structure.

In detail, FIG. 1 is a perspective view of a chip-stacked semiconductor package CSP in which a second chip 22 is stacked on a first chip 12, respectively. FIG. 2 is a cross-sectional view taken along a Y direction of FIG. 1 at A-A1. FIGS. 1 and 2 are views for explaining detection of a stacking accuracy and a joint gap between the first chip 12 and the second chip 22 by using a first detection pad group MPD1 of the first chip 12 and a second detection pad group MPD2 of the second chip 22.

In FIGS. 1 and 2, an X direction and the Y direction indicate horizontal directions that are parallel to respective surfaces of the first chip 12 and the second chip 22, and a Z direction indicates a direction that is perpendicular to the respective surfaces of the first chip 12 and the second chip 22.

The first chip 12 may include a first chip region 13, and a first scribe lane region 15 around the first chip region 13. According to an embodiment, the first scribe lane region 15 may be in the vicinity of the first chip region 13. According to an embodiment, the first scribe lane region 15 may be adjacent to the first chip region 13. According to an embodiment, the first scribe lane region 15 may be directly adjacent to the first chip region 13. FIG. 1 illustrates only one first scribe lane region 15 for convenience of explanation. The first chip 12 may be a wafer-level chip or chip-level chip. The first scribe lane region 15 may be cut out from a final structure of the chip-stacked semiconductor package CSP and thus may be partially or completely removed.

According to an embodiment, a plurality of first chip pads PD1 are formed in the first chip region 13. According to an embodiment, the first detection pad group MPD1 may include one or more of the first chip pads PD1. That is, some of the first chip pads PD1 may constitute the first detection pad group MPD1 The first detection pad group MPD1 may include a first detection pad 14 and a second detection pad 16.

According to an embodiment, the first detection pad 14 may be located adjacent to the second detection pad 16. According to an embodiment, planar shapes of the first detection pad 14 and the second detection pad 16 may be circles. According to an embodiment, a radius of each of the first detection pad 14 and the second detection pad 16 may be 10 μm to 400 μm. Although, according to an embodiment, the first detection pad 14 and the second detection pad 16, which constitute the first detection pad group MPD1, have the same planar sizes as each of the other first chip pads PD1 that are not part of the first detection pad group MPD1, according to another embodiment, the first detection pad 14 and the second detection pad 16 may have larger planar sizes than each of the other first chip pads PD1.

For example, when each of the other first chip pad PD1 has a radius of 10 μm to 20 μm, each of the first detection pad 14 and the second detection pad 16 may have a radius of 50 μm to 400 μm. Although the first chip pads PD1 are illustrated as being formed on the entire surface of a chip body layer, they may be formed on an edge portion or center portion of the chip body layer.

A test terminal group TPD is formed on the first scribe lane region 15. The test terminal group TPD includes a first test terminal 17 and a second test terminal 19. The first test terminal 17 may be electrically connected to the first detection pad 14 by a first conductive line 29a. The second test terminal 19 may be electrically connected to the second detection pad 16 by a second conductive line 29e.

The first conductive line 29a and the second conductive line 29e may be wiring lines formed on the first chip 12. When the first scribe lane region 15 is cut during manufacturing, the first test terminal 17 and the second test terminal 19 may partially remain in the first scribe lane region 15 of the final structure of the chip-stacked semiconductor package CSP. Also, when the first scribe lane region 15 is cut during manufacturing, the first conductive line 29a and the second conductive line 29e may remain in the first scribe lane region 15 of the final structure of the chip-stacked semiconductor package CSP.

The second chip 22 may be stacked on the first chip 12. The second chip 22 may include a second chip region 23. The second chip 22 may be a chip level chip. A plurality of second chip pads PD2 are formed on the second chip region 23. According to an embodiment, the second detection pad group MPD2 may include one or more of the second t chip pads PD2. That is, some of the second chip pads PD2 constitute the second detection pad group MPD2. The second detection pad group MPD2 may include a third detection pad 24 and a fourth detection pad 26.

According to an embodiment, the third detection pad 24 may be located adjacent to the fourth detection pad 26. Respective planar shapes of the third detection pad 24 and the fourth detection pad 26 may be circles. According to an embodiment, a radius of each of the third detection pad 24 and the fourth detection pad 26 may be 10 μm to 400 μm.

Although, according to an embodiment, the third detection pad 24 and the fourth detection pad 26, which constitute the second detection pad group MPD2, have the same planar sizes as each of the other second chip pads PD2 that are not part of the second detection pad group MPD2, according to another embodiment, the third detection pad 24 and the fourth detection pad 26 may have larger planar sizes than each of the other second chip pads PD2. For example, when the other second chip pad PD2 has a radius of 10 μm to 20 μm, each of the third detection pad 24 and the fourth detection pad 26 may have a radius of 50 μm to 400 μm. Although the second chip pads PD2 are illustrated as being formed on the entire surface of a chip body layer, they may be formed on an edge portion or center portion of the chip body layer. The third detection pad 24 may be electrically connected to the fourth detection pad 26 by a third conductive line 29c. The third conductive line 29c may be a wiring line formed on the second chip 22.

The third detection pad 24 and the fourth detection pad 26 may face the first detection pad 14 and the second detection pad 16, respectively. A medium unit 18(ME) electrically and physically connecting the first detection pad 14 to the third detection pad 24 may be located between the first chip 12 and the second chip 22. The medium unit 18(ME) may be a bump, for example, a solder bump. Accordingly, the first detection pad 14 of the first chip 12 and the third detection pad 24 of the second chip 22 may be electrically and physically connected to each other through the medium unit 18(ME), which forms a fourth conductive line 29b.

According to an embodiment, a non-medium unit 20(NME) may be located between the first chip 12 and the second chip 22, such that the second detection pad 16 and the fourth detection pad 26 are not physically connected to each other. According to an embodiment, the non-medium unit 20(NME) may be a sealant (or encapsulant). Accordingly, the second detection pad 16 of the first chip 12 and the fourth detection pad 26 of the second chip 22 are not physically connected to each other. However, the second detection pad 16 of the first chip 12 and the fourth detection pad 26 of the second chip 22 may be electrically connected based on a capacitive effect through a fifth conductive line 29d.

According to an embodiment, the medium unit 18(ME) may include material having a high conductive property, such as metals, for electrically connecting the first detection pad 14 of the first chip 12 and the third detection pad 24 of the second chip 22. On the other hand, the non-medium unit 20(NME) may include material having a low conductive property, such as insulators or dielectric elements, for generating a capacitive effect between the capacitively connecting the second detection pad 16 of the first chip 12 and the fourth detection pad 26 of the second chip 22.

The chip-stacked semiconductor package CSP may detect a stacking accuracy and a joint gap between the first chip 12 and the second chip 22 by using the first detection pad group MPD1 of the first chip 12 and the second detection pad group MPD2 of the second chip 22.

In detail, the chip-stacked semiconductor package CSP may measure a capacitance between the second detection pad 16 and the fourth detection pad 26 by applying a voltage to the first test terminal 17 and the second test terminal 19 by using a testing apparatus 28. For example, a voltage may be applied toward the first conductive line 29a, the fourth conductive line 29b, the third conductive line 29c, the fifth conductive line 29d, and the second conductive line 29e by the testing apparatus 28, and thus the capacitance between the second detection pad 16 and the fourth detection pad 26 may be measured.

According to an embodiment, the testing apparatus 28 is testing a chip-stacked semiconductor package including a first chip having a first detection pad and a second detection pad, and a second chip stacked on the first chip with a gap therebetween and having a third detection pad facing the first detection pad having a first medium therebetween and a fourth detection pad facing the second detection pad having a second medium therebetween. The testing apparatus may include a memory storing one or more instructions and one or more processors configured to execute the one or more instructions to apply a first voltage to the first detection pad; measure a second voltage at the second detection pad, the second voltage corresponding to the first voltage propagating through the first detection pad, the third detection pad, the fourth detection pad and the second detection pad and obtain a capacitance between the second detection pad and the fourth detection pad based on the measure second voltage.

According to an embodiment, the one or more processors may be configured to obtain one of a stacking accuracy or a join gap information between the first chip and the second chip based on the measured capacitance. According to an embodiment, the one or more processors may be configured to identify an overlapping area between the second detection pad and the fourth detection pad based on the measured capacitance; and obtain the stacking accuracy between the first chip and the second chip based on the overlapping area. According to an embodiment, the one or more processors may be configured to identify a distance between the second detection pad and the fourth detection pad based on the measured capacitance; and obtain the joint gap information between the first chip and the second chip based on the measured distance.

When the capacitance between the second detection pad 16 and the fourth detection pad 26 is measured, the stacking accuracy between the first chip 12 and the second chip 22 may be detected based on an area by which the first detection pad 14 of the first chip 12 horizontally overlaps the third detection pad 24 of the second chip 22. Accordingly, the chip-stacked semiconductor package CSP according to the inventive concept may detect the stacking accuracy between the first chip 12 and the second chip 22 during an in-line manufacturing process, without being affected by a process of cutting the second chip 22.

When the chip-stacked semiconductor package CSP according to the inventive concept measures the capacitance between the second detection pad 16 and the fourth detection pad 26, the chip-stacked semiconductor package CSP may detect the joint gap between the first chip 12 and the second chip 22. Thus, the chip-stacked semiconductor package CSP according to the inventive concept may non-destructively measure and obtain the joint gap during an in-line manufacturing process. The detections of the stacking accuracy and the joint gap via the capacitance measurement in the chip-stacked semiconductor package CSP according to the inventive concept will be described in greater detail later.

Figure 3:
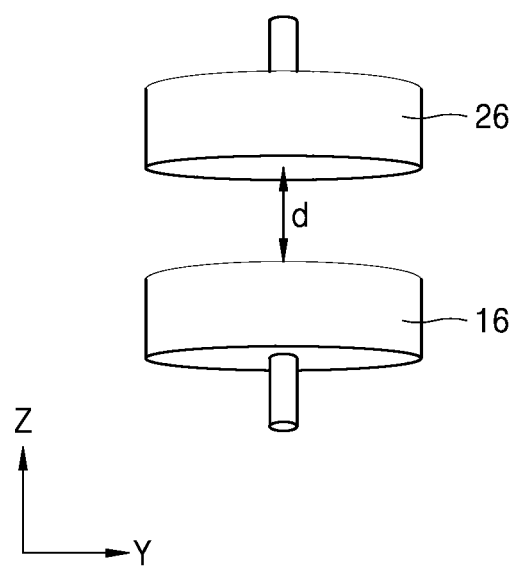
FIG. 3 is a diagram for explaining measurement of the capacitance by the chip-stacked semiconductor package of FIGS. 1 and 2.

FIG. 3 is a diagram for explaining measurement of the capacitance by the chip-stacked semiconductor package CSP of FIGS. 1 and 2.

In detail, the same reference numerals in FIG. 3 as those in FIGS. 1 and 2 indicate the same elements. The chip-stacked semiconductor package CSP of FIGS. 1 and 2 may measure the capacitance between the second detection pad 16 of the first chip 12 and the fourth detection pad 26 of the second chip 22 separated from each other by a gap d by using the testing apparatus 28.

The capacitance may be $C=\varepsilon_0 * \varepsilon_r * (A/d)$, where C may indicate a capacitance, A may indicate the area of the second detection pad 16 or the fourth detection pad 26, d may indicate a distance between the second detection pad 16 and the fourth detection pad 26, $\varepsilon_0$ indicate a vacuum dielectric constant, and $\varepsilon_r$ may indicate a relative dielectric constant of a dielectric located between the second detection pad 16 and the fourth detection pad 26.

The chip-stacked semiconductor package CSP of FIGS. 1 and 2 may include the second detection pad 16 and the fourth detection pad 26 each having a circular planar shape. According to some embodiments, a radius of each of the second detection pad 16 and the fourth detection pad 26 may be 10 μM to 400 μm.

For example, when the radius of each of the second detection pad 16 and the fourth detection pad 26 is 10 μm, the gap d between the second detection pad 16 and the fourth detection pad 26 is 8 μm, and a relative dielectric constant of an underfill, a sealant, or an adhesive between the second detection pad 16 and the fourth detection pad 26 is 3.0, the capacitance C may be calculated to be about 0.001 pF by using the following formula.

$$C=8.85*10^{-12}*3*(\pi*(10*10^{-6})^2/(8*10^{-6}))$$

When the radius of each of the second detection pad 16 and the fourth detection pad 26 is 100 μm, the gap d between the second detection pad 16 and the fourth detection pad 26 is 8 μm, and the relative dielectric constant of the underfill, the sealant, or the adhesive between the second detection pad 16 and the fourth detection pad 26 is 3.0, the capacitance C may be calculated to be about 0.1 pF by using the following formula.

$$C=8.85*10^{-12}*3*(\pi*(100*10^{-6})^2/(8*10^{-6}))$$

Figure 4A:
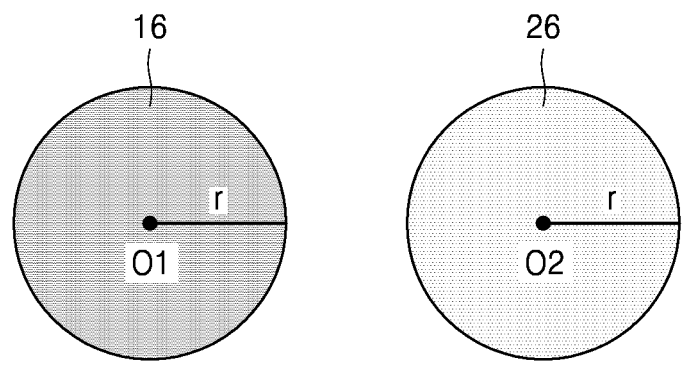
FIGS. 4A through 4C are plan views for explaining the stacking accuracy of the chip-stacked semiconductor package of FIGS. 1 and 2.
Figure 4B:
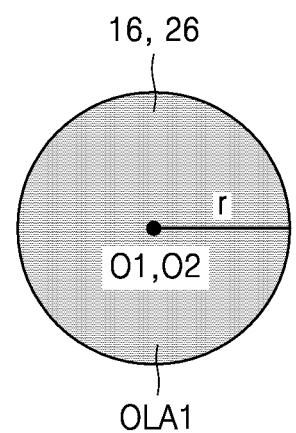
Figure 4C:
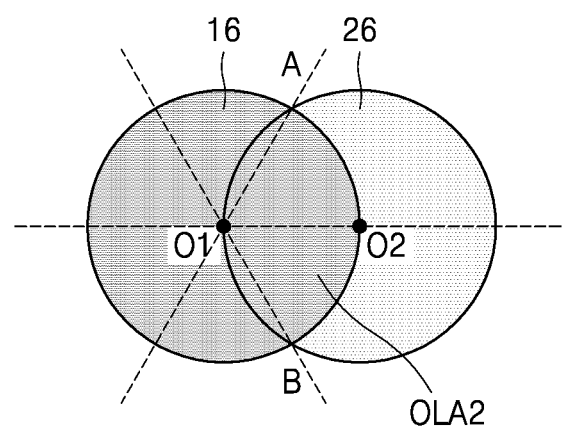

FIGS. 4A through 4C are plan views for explaining the stacking accuracy of the chip-stacked semiconductor package CSP of FIGS. 1 and 2.

In detail, the same reference numerals in FIGS. 4A through 4C as those in FIGS. 1 and 2 indicate the same elements. FIGS. 4A through 4C illustrate that each of the second detection pad 16 of the first chip 12 and the fourth detection pad 26 of the second chip 22 of FIG. 1 has a circular planar shape. FIGS. 4A through 4C illustrate a case where a gap between the second detection pad 16 and the fourth detection pad 26 is assumed to be constant at 8 μm and each of the second detection pad 16 and the fourth detection pad 26 has a radius of 10 μm.

When the gap between the second detection pad 16 and the fourth detection pad 26 is constant and the capacitance between the second detection pad 16 and the fourth detection pad 26 is measured, the stacking accuracy may be calculated and evaluated by calculating an area by which the second detection pad 16 and the fourth detection pad 26 overlap each other.

FIG. 4A illustrates a case where the fourth detection pad 26 of the second chip 22 is not stacked on the second detection pad 16 of the first chip 12, and accordingly there is no overlapping areas therebetween. In this case, a stacking accuracy represented as a distance between a center point O1 of the first chip 12 and a center point O2 of the second chip 22 is no less than 20 μm being twice a radius r, and no capacitances are measured between the second detection pad 16 and the fourth detection pad 26.

FIG. 4B illustrates a case where the fourth detection pad 26 of the second chip 22 is accurately stacked on the second detection pad 16 of the first chip 12 and accordingly, a two-dimensionally overlapping area OLA1 is the same as the area of the second detection pad 16 or the fourth detection pad 26. In other words, a reference area by which the second detection pad 16 and the fourth detection pad 26 overlap each other horizontally may be 100% of the area of the second detection pad 16 or the fourth detection pad 26. The reference area by which the second detection pad 16 and the fourth detection pad 26 overlap each other horizontally may be $\pi*r^2$ (where r is a radius), namely, 3.142 $r^2$.

In the case of FIG. 4B, because the center point O1 of the first chip 12 and the center point O2 of the second chip 22 are exactly identical with each other, the stacking accuracy represented as a distance between the center point O1 of the first chip 12 and the center point O2 of the second chip 22 may be 0 μm.

As described above with reference to FIG. 3, a measured capacitance between the second detection pad 16 and the fourth detection pad 26, namely, a reference capacitance (i.e., an upper reference capacitance), when the center point O1 of the first chip 12 and the center point O2 of the second chip 22 are exactly identical with each other may be about 0.001 pF. The reference capacitance may be used to detect the stacking accuracy between the second detection pad 16 and the fourth detection pad 26.

FIG. 4C illustrates a case where the fourth detection pad 26 of the second chip 22 partially overlaps the second detection pad 16 of the first chip 12 by the radius r. A two-dimensionally overlapping area OLA2 by which the fourth detection pad 26 is stacked on the second detection pad 16 may be calculated as in $2((\pi/3)-(\sqrt{3}/4))\times r^2$, and may be 1.228 $r^2$. The two-dimensionally overlapping area OLA2 of FIG. 4C, namely, an area OLA2 according to A-O1-B-O2-A, may be 39% of the reference area OLA1 of FIG. 4B. In FIG. 4C, an interior angle of A-O1-B may be 120°.

In the case of FIG. 4C, a stacking accuracy represented as a distance between the center point O1 of the first chip 12 and the center point O2 of the second chip 22 may be ±10 µm. As described above with reference to FIG. 3, the measured capacitance between the second detection pad 16 and the fourth detection pad 26 may be 0.00039 pF (lower reference capacitance), which is 39% of the reference capacitance (upper reference capacitance) of 0.001 pF.

When the two-dimensionally overlapping area OLA2 by which the fourth detection pad 26 overlaps the second detection pad 16 is 39% to 100% of the reference area OLA1, the chip-stacked semiconductor package CSP may provide a good stacking accuracy and thus reliability of the chip-stacked semiconductor package CSP may be high.

As such, the chip-stacked semiconductor package CSP according to the inventive concept may obtain an area by which the second detection pad 16 and the fourth detection pad 26 horizontally overlap each other, from the measured capacitance between the second detection pad 16 and the fourth detection pad 26. In addition, the stacking accuracy of the chip-stacked semiconductor package CSP may be determined and evaluated by the measured capacitance between the second detection pad 16 and the fourth detection pad 26 or the horizontally overlapping area between the second detection pad 16 and the fourth detection pad 26.

For example, when the second detection pad 16 or the fourth detection pad 26 has a radius of 10 µm to 400 µm, the area by which the fourth detection pad 26 overlaps the second detection pad 16 two-dimensionally may be 314 µm² to 5024 µm² (reference area). Thus, when the area by which the fourth detection pad 26 two-dimensionally overlaps the second detection pad 16 is 39% or greater of the above-described reference area, the stacking accuracy of the chip-stacked semiconductor package CSP may be evaluated as being good.

Figure 5A:
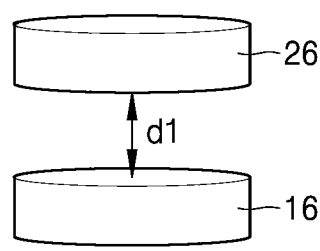
FIGS. 5A through 5C are cross-sectional views for explaining the joint gap of the chip-stacked semiconductor package of FIGS. 1 and 2.
Figure 5B:
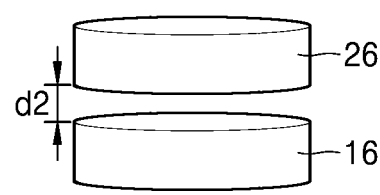
Figure 5C:
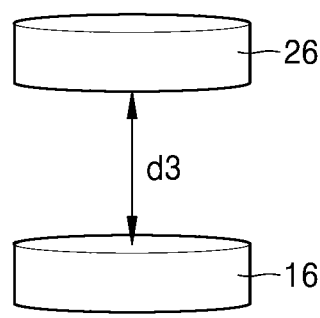

FIGS. 5A through 5C are cross-sectional views for explaining the joint gap of the chip-stacked semiconductor package CSP of FIGS. 1 and 2.

In detail, the same reference numerals in FIGS. 5A through 5C as those in FIGS. 1 and 2 indicate the same elements. FIGS. 5A through 5C illustrate that each of the second detection pad 16 of the first chip 12 and the fourth detection pad 26 of the second chip 22 of FIG. 1 has a circular planar shape. FIGS. 5A through 5C illustrate a case where each of the second detection pad 16 and the fourth detection pad 26 of the second chip 22 is assumed to have a radius of 100 µm, the area of each of the second detection pad 16 and the fourth detection pad 26 is assumed to be uniform, and the joint gap between the second detection pad 16 and the fourth detection pad 26 is a reference joint gap, for example, 8 µm.

When the respective areas of the second detection pad 16 and the fourth detection pad 26 are uniform and the capacitance between the second detection pad 16 and the fourth detection pad 26 is measured, the joint gap between the second detection pad 16 and the fourth detection pad 26 may be detected.

Referring to FIG. 5A, when a joint gap d1 between the second detection pad 16 of the first chip 12 and the fourth detection pad 26 of the second chip 22 is a reference joint gap, for example, 8 µm, a reference capacitance between the second detection pad 16 and the fourth detection pad 26 may be 0.1 pF.

Referring to FIG. 5B, when the capacitance between the second detection pad 16 and the fourth detection pad 26 is 0.2 pF, which is 200% of the reference capacitance of 0.1 pF, a joint gap d2 (lower reference joint gap) between the second detection pad 16 and the fourth detection pad 26 may be 4 µm, which is ½ of the reference joint gap.

Referring to FIG. 5C, when the capacitance between the second detection pad 16 and the fourth detection pad 26 is 0.067 pF, which is 67% of the reference capacitance of 0.1 pF, a joint gap d3 (upper reference joint gap) between the second detection pad 16 and the fourth detection pad 26 may be 12 µm, which is 3/2 of the reference joint gap.

As such, the chip-stacked semiconductor package CSP according to the inventive concept may detect the joint gaps d1, d2, and d3 between the second detection pad 16 and the fourth detection pad 26, due to the measured capacitance between the second detection pad 16 and the fourth detection pad 26.

Furthermore, the chip-stacked semiconductor package CSP according to the inventive concept may obtain the joint gap d1, which is the reference joint gap d1, between the second detection pad 16 and the fourth detection pad 26, based on the measured reference capacitance between the second detection pad 16 and the fourth detection pad 26.

In other words, when the joint gaps d2 and d3 between the second detection pad 16 of the first chip 12 and the fourth detection pad 26 of the second chip 22 are ½ to 3/2 of the reference joint gap d1 between the second detection pad 16 and the fourth detection pad 26, the joint gap of the chip-stacked semiconductor package CSP may be evaluated as being good.

Figure 6:
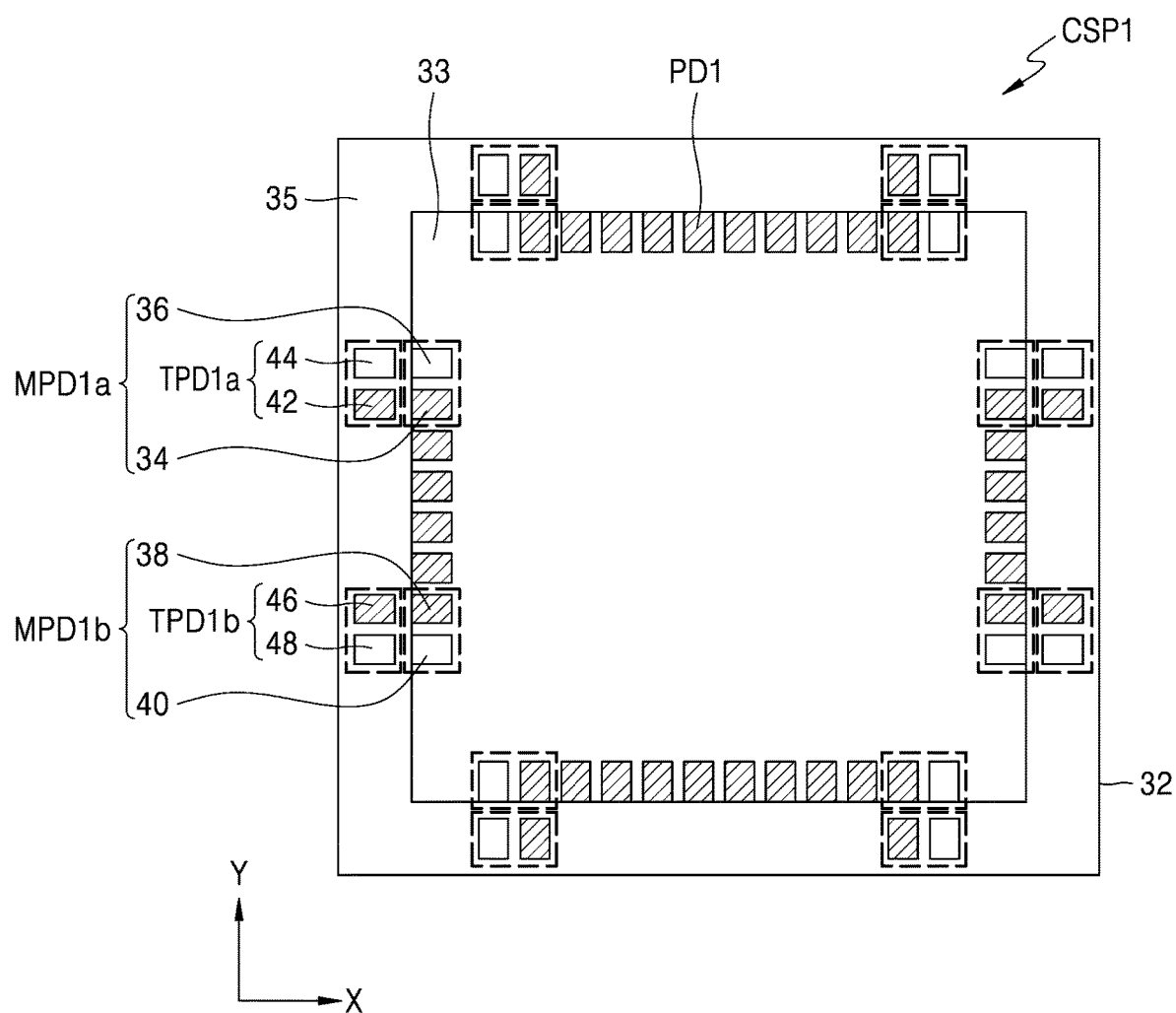
FIGS. 6 and 7 are layout views of a chip-stacked semiconductor package according to an embodiment of the inventive concept.
Figure 7:
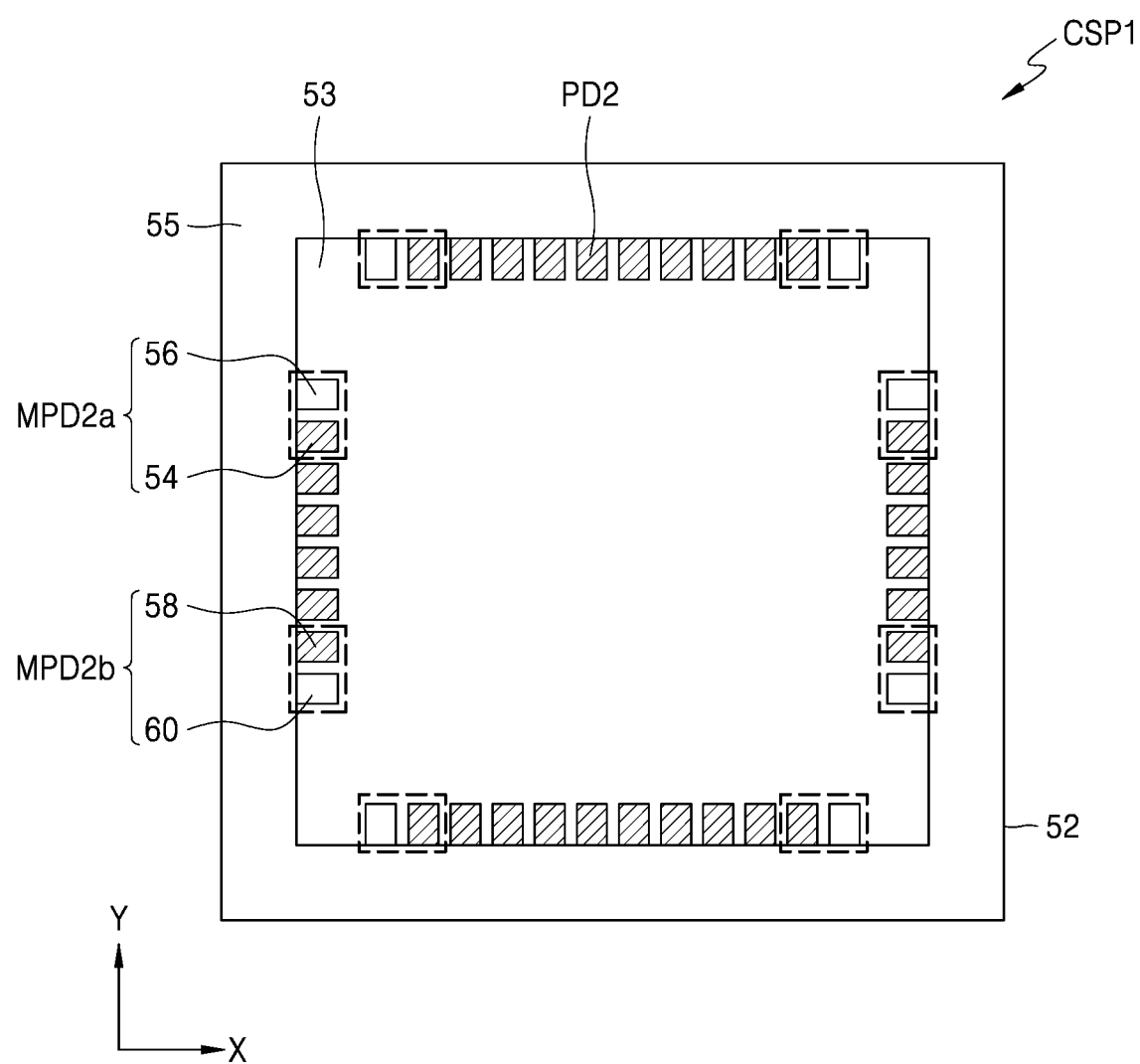

FIGS. 6 and 7 are layout views of a chip-stacked semiconductor package CSP1 according to an embodiment of the inventive concept.

In detail, FIG. 6 may be a layout view of a first chip 32 of the chip-stacked semiconductor package CSP1, and FIG. 7 may be a layout view of a second chip 52 that may be stacked on the first chip 32 of FIG. 6. The first chip 32 may correspond to the first chip 12 of FIGS. 1 and 2, and the second chip 52 may correspond to the second chip 22 of FIGS. 1 and 2. Descriptions of FIGS. 6 and 7 identical to those given above with reference to FIGS. 1 and 2 will be omitted or briefly given below.

The first chip 32 may include a first chip region 33, and a first scribe lane region 35 around the first chip region 33. The first scribe lane region 35 may be cut out from a final structure of the chip-stacked semiconductor package CSP1 and thus may be partially or completely removed.

A plurality of first chip pads PD1 are formed on an edge portion of the first chip region 33. Some of the first chip pads PD1 constitute a plurality of first detection pad groups MPD1a and MPD1b. The first detection pad groups MPD1a and MPD1b may include first detection pads 34 and 38 and second detection pads 36 and 40.

The first detection pad groups MPD1a and MPD1b include a first sub detection pad group MPD1a and a second sub detection pad group MPD1b separated from each other. The first sub detection pad group MPD1a may include the first detection pad 34 and the second detection pad 36 and the second sub detection pad group MPD1b may include the first detection pad 38 and the second detection pad 40. The first sub detection pad group MPD1a may be used to detect the stacking accuracy. The second sub detection pad group MPD1b may be used to detect the joint gap.

A plurality of test terminal groups TPD1a and TPD are formed on the first scribe lane region 35. The test terminal groups TPD1a and TPD1b include first test terminals 42 and 46 and second test terminals. The test terminal groups TPD1a and TPD1b include a first sub test terminal group TPD1a and a second sub test terminal group TPD1b separated from each other. The first sub test terminal group TPD1a may include the first terminal 42 and the second terminal 44 and the second sub test terminal group TPD1b may include the first terminal 46 and the second terminal 48.

The first sub test pad group TPD1a may be used to detect the stacking accuracy. The second sub test pad group TPD may be used to detect the joint gap. The first test terminals 42 and 46 may be electrically connected to the first detection pads 34 and 38 by conductive lines. The second test terminals 44 and 48 may be electrically connected to the second detection pads 36 and 40 by conductive lines.

The second chip 52 may be stacked on the first chip 32. The second chip 52 may include a second chip region 53 and a second scribe lane region 55. A plurality of second chip pads PD2 are formed on an edge portion of the second chip region 53. Some of the second chip pads PD2 constitute a plurality of second detection pad groups MPD2a and MPD2b. The second detection pad groups MPD2a and MPD2b may include third detection pads 54 and 58 and fourth detection pads 56 and 60.

The second detection pad groups MPD2a and MPD2b include a third sub detection pad group MPD2a and a second sub detection pad group MPD2b separated from each other. The third sub detection pad group MPD2a may include the third detection pad 54 and the fourth detection pad 56 and the fourth sub detection pad group MPD2b may include the third detection pad 58 and the fourth detected pad 60. The third sub detection pad group MPD2a may be used to detect the stacking accuracy. The fourth sub detection pad group MPD2b may be used to detect the joint gap.

The third detection pads 54 and 58 may be electrically connected to the fourth detection pads 56 and 60, respectively, via conductive lines. The third detection pads 54 and 58 and the fourth detection pads 56 and 60 may face the first detection pads 34 and 38 and the second detection pads 36 and 40, respectively. As described above, the first detection pads 34 and 38 may be electrically and physically connected to the third detection pads 54 and 58, respectively. The second detection pads 36 and 40 may not be physically connected to the fourth detection pads 56 and 60, respectively. According to an embodiment, the second detection pads 36 and 40 may be electrically connected to the fourth detection pads 56 and 60 through a capacitive effect.

Figure 8:
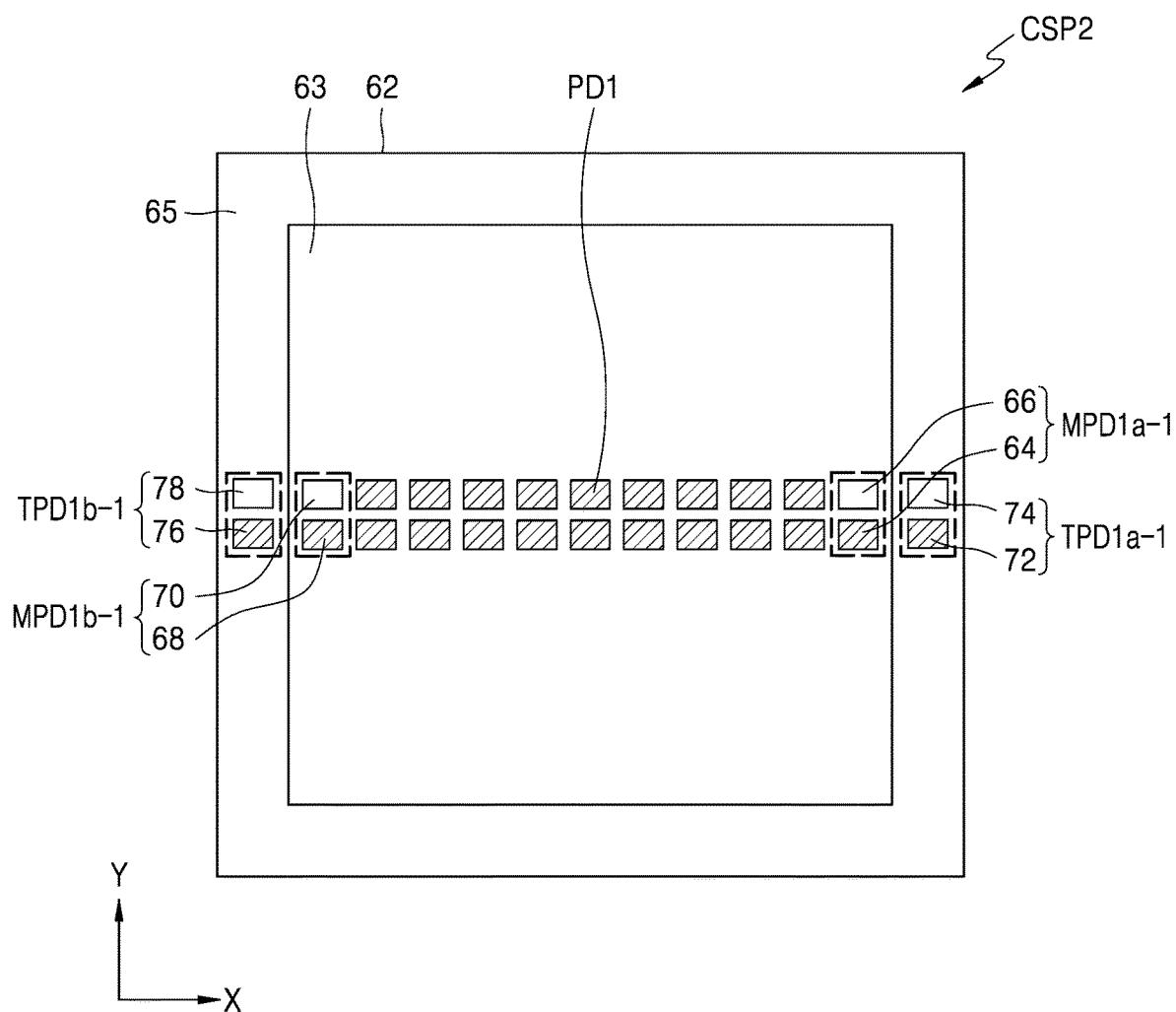
FIGS. 8 and 9 are layout views of a chip-stacked semiconductor package according to an embodiment of the inventive concept.
Figure 9:
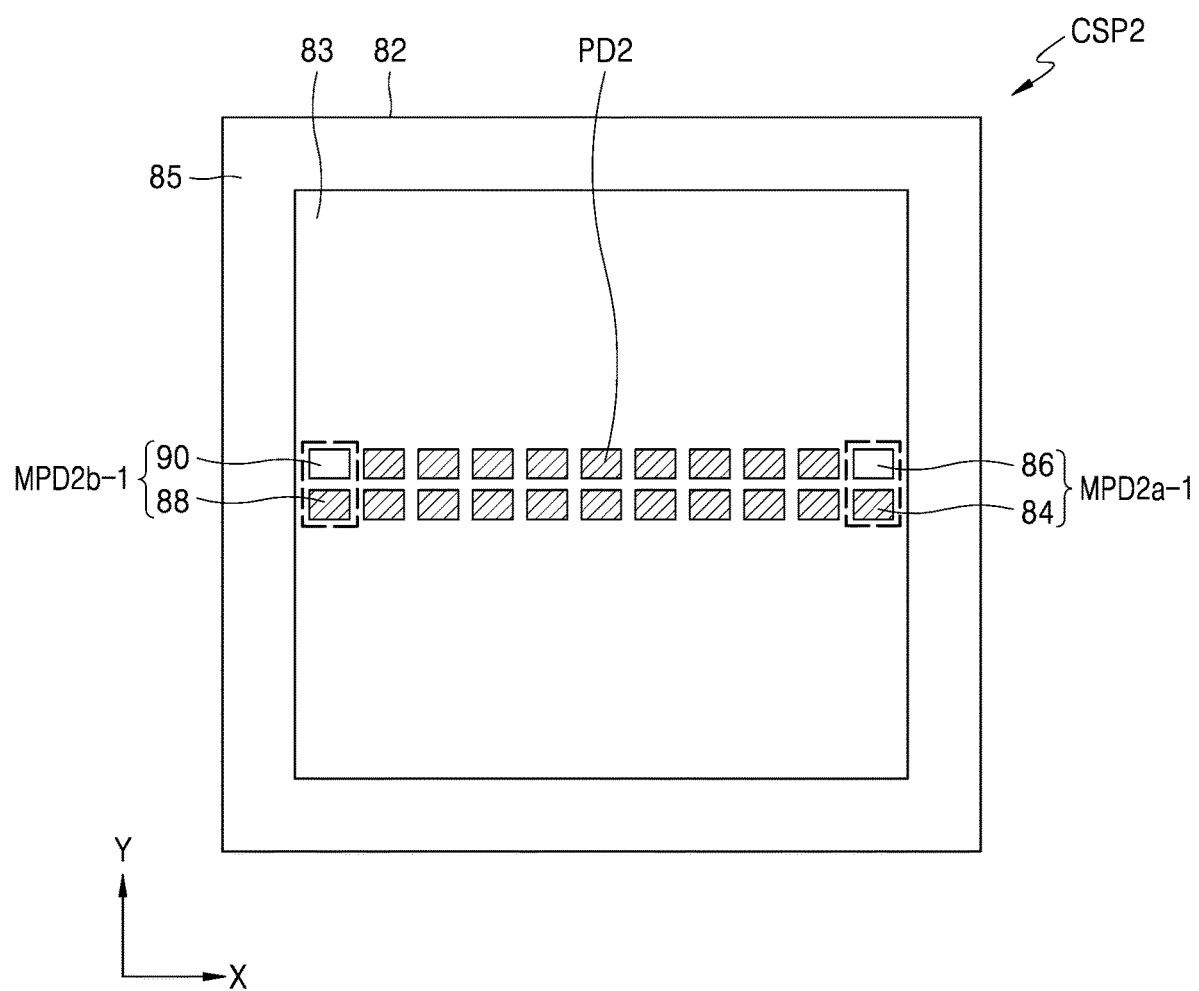

FIGS. 8 and 9 are layout views of a chip-stacked semiconductor package CSP2 according to an embodiment of the inventive concept.

In detail, FIG. 8 may be a layout view of a first chip 62 of the chip-stacked semiconductor package CSP2, and FIG. 9 may be a layout view of a second chip 82 that may be stacked on the first chip 62 of FIG. 8. The first chip 62 may correspond to the first chip 12 of FIGS. 1 and 2, and the second chip 82 may correspond to the second chip 22 of FIGS. 1 and 2. Descriptions of FIGS. 8 and 9 identical to those given above with reference to FIGS. 1 and 2 will be omitted or briefly given below.

The first chip 62 may include a first chip region 63, and a first scribe lane region 65 around the first chip region 63. The first scribe lane region 65 may be cut out from a final structure of the chip-stacked semiconductor package CSP2 and thus may be partially or completely removed.

A plurality of first chip pads PD1 are formed on a center portion of the first chip region 63. Some of the first chip pads PD1 constitute a plurality of first detection pad groups MPD1a-1 and MPD1b-1. The first detection pad groups MPD1a-1 and MPD1b-1 may include first detection pads 64 and 68 and second detection pads 66 and 70.

The first detection pad groups MPD1a-1 and MPD1b-1 include a first sub detection pad group MPD1a-1 and a second sub detection pad group MPD1b-1 separated from each other on both sides of a body layer. The first sub detection pad group MPD1a-1 may be used to detect the stacking accuracy. The second sub detection pad group MPD1b-1 may be used to detect the joint gap.

A plurality of test terminal groups TPD1a-1 and TPD1b-1 are formed on the first scribe lane region 65. The test terminal groups TPD1a-1 and TPD1b-1 include first test terminals 72 and 76, respectively, and second test terminals 74 and 78, respectively. The test terminal groups TPD1a-1 and TPD1b-1 include a first sub test terminal group TPD1a-1 and a second sub test terminal group TPD1b-1 separated from each other on both sides of the body layer.

The first sub test pad group TPD1a-1 may be used to detect the stacking accuracy. The second sub test pad group TPD1b-1 may be used to detect the joint gap. The first test terminals 72 and 76 may be electrically connected to the first detection pads 64 and 68 by conductive lines. The second test terminals 74 and 78 may be electrically connected to the second detection pads 66 and 70 by conductive lines.

The second chip 82 may be stacked on the first chip 62. The second chip 82 may include a second chip region 83 and a second scribe lane region 85. A plurality of second chip pads PD2 are formed on a center portion of the body layer on the second chip region 83. Some of the second chip pads PD2 constitute a plurality of second detection pad groups MPD2a-1 and MPD2b-1. The second detection pad groups MPD2a-1 and MPD2b-1 may include third detection pads 84 and 88, respectively, and fourth detection pads 86 and 90, respectively.

The second detection pad groups MPD2a-1 and MPD2b-1 include a third sub detection pad group MPD2a-1 and a second sub detection pad group MPD2b-1 separated from each other. The third sub detection pad group MPD2a-1 may be used to detect the stacking accuracy. The fourth sub detection pad group MPD2b-1 may be used to detect the joint gap.

The third detection pads 84 and 88 may be electrically connected to the fourth detection pads 86 and 90, respectively, via conductive lines. The third detection pads 84 and 88 and the fourth detection pads 86 and 90 may face the first detection pads 64 and 68 and the second detection pads 66 and 70, respectively. As described above, the first detection pads 64 and 68 may be electrically and physically connected to the third detection pads 84 and 88, respectively. The second detection pads 66 and 70 may not be physically connected to the fourth detection pads 86 and 90, respectively. According to an embodiment, the second detection pads 66 and 70 may be electrically connected to the fourth detection pads 86 and 90 through a capacitive effect FIGS. 10A and 10B are plan views illustrating shapes and sizes of chip pads and detection pads of a chip-stacked semiconductor package according to an embodiment of the inventive concept.

Figure 10A:
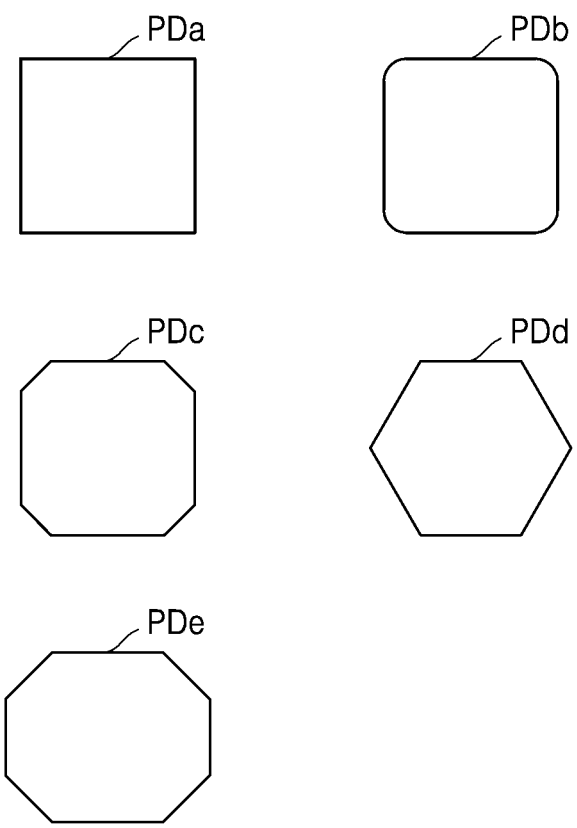
FIGS. 10A and 10B are plan views illustrating shapes and sizes of chip pads and detection pads of a chip-stacked semiconductor package according to an embodiment of the inventive concept.

FIG. 10A illustrates planar shapes of chip pads PDa through PDe that are used in the above-described chip-stacked semiconductor package according to an embodiment of the inventive concept. The chip pads PDa through PDe may correspond to the first chip pads PD1 and the second chip pads PD2 that are used in the above-described first chip or second chip. The chip pads PDa through PDe may correspond to the above-described detection pads, for example, the first, second, third, and fourth detection pads 14, 16, 24, and 26 of FIGS. 1 and 2.

The planar shapes of the chip pads PDa through PDe may vary. The planar shapes of the chip pads PDa through PDe may be polygons other than a circle as described above. For example, the planar shapes of the chip pads PDa through PDe may be a quadrangle (PDa), a quadrangle (PDb) with round corners, a quadrangle (PDc) with cut corners, an hexagon (PDd), or an octagon (PDe).

Figure 10B:
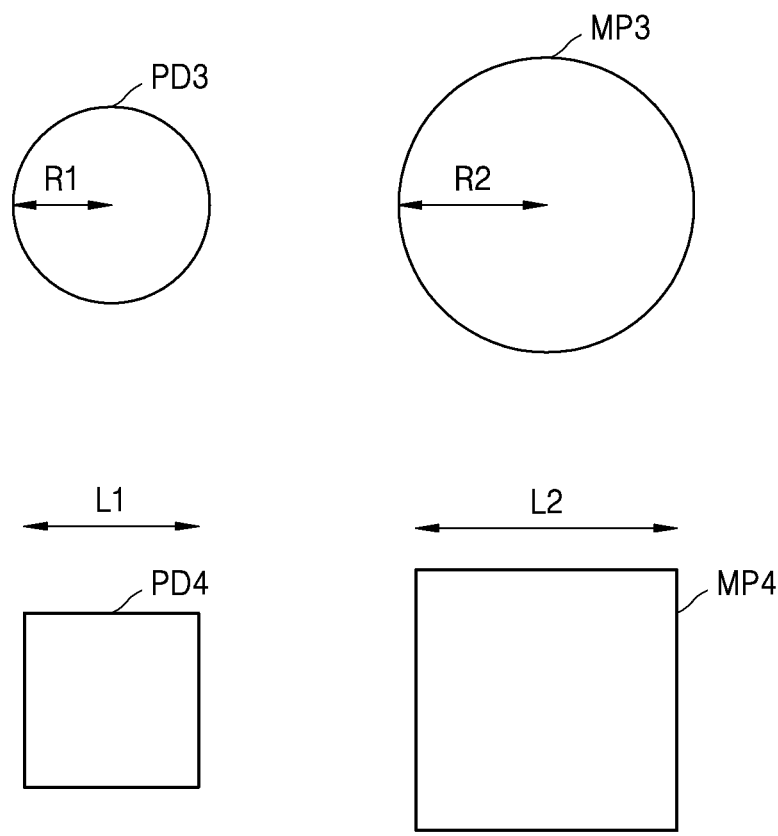

FIG. 10B illustrates planar sizes of chip pads PD3 and PD4 and detection pads MP3 and MP4 that are used in the above-described chip-stacked semiconductor package according to an embodiment of the inventive concept. The chip pads PD3 and PD4 may correspond to the first chip pad PD1 and the second chip pad PD2 that are used in the above-described first chip or second chip. The detection pads MP3 and MP4 may correspond to the above-described detection pads, for example, the first, second, third, and fourth detection pads 14, 16, 24, and 26 of FIGS. 1 and 2.

Respective planar shapes of the chip pad PD3 and the detection pad MP3 may be circles. Respective radii R1 and R2 of the chip pad PD3 and the detection pad MP3 may be different. For example, the radius R2 of the detection pad MP3 may be greater than the radius R1 of the chip pad PD3. In this case, capacitance measurement via the detection pad MP3 may be easy.

Respective planar shapes of the chip pad PD4 and the detection pad MP4 may be quadrangles. Lengths L1 and L2 of respective one sides of the chip pad PD4 and the detection pad MP4 may be different. For example, the length L2 of one side of the detection pad MP4 may be greater than the length L1 of one side of the chip pad PD4. In this case, capacitance measurement via the detection pad MP4 may be easy.

Figure 11:
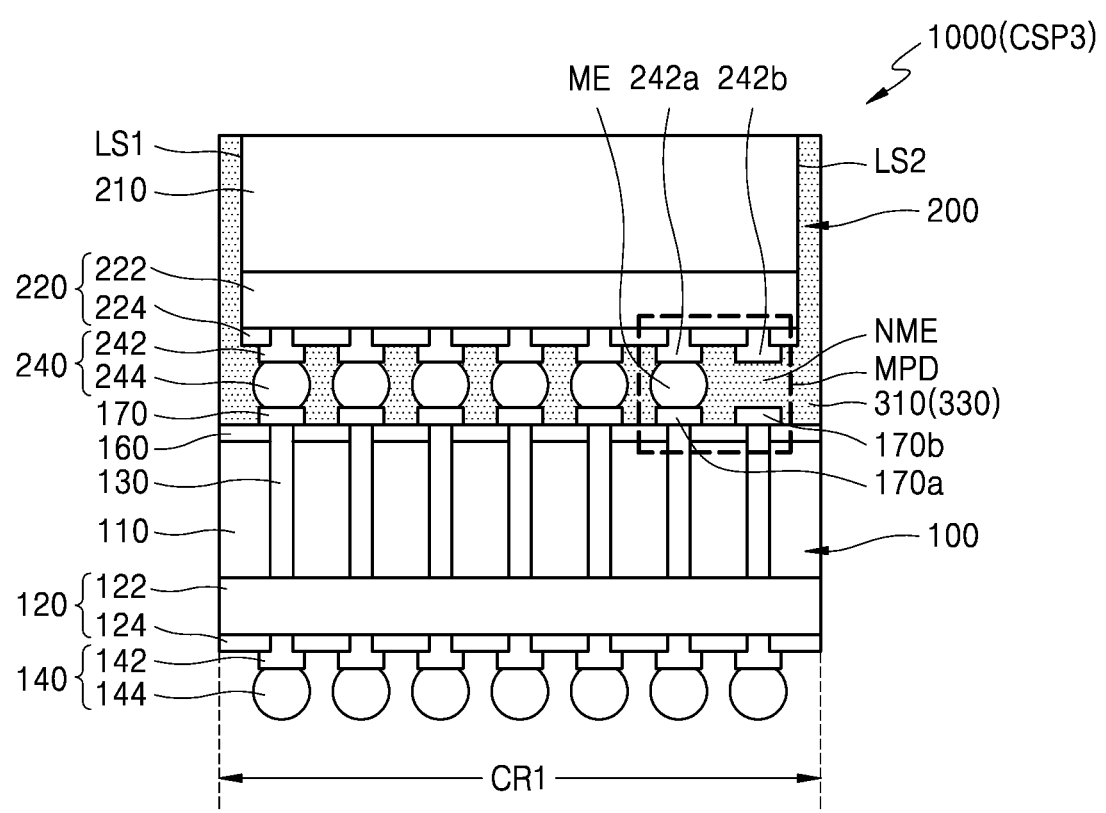
FIG. 11 is a cross-sectional view of a chip-stacked semiconductor package according to an embodiment of the inventive concept.

FIG. 11 is a cross-sectional view of a chip-stacked semiconductor package 1000 (CSP3) according to an embodiment of the inventive concept.

In detail, the chip-stacked semiconductor package 1000 (CSP3) may be a package manufactured by a Chip on Wafer (CoW) technology. The chip-stacked semiconductor package 1000 may include a first chip 100, a second chip 200, and a sealant (or encapsulant) 330. The first chip 100 may include a body layer 110 (a base wafer), a lower insulating layer 120, through silicon vias (TSVs) 130, first connecting members 140, a protective layer 160, and first chip pads 170. According to an embodiment, bumps 144 are exposed through the bottom of the first chip 100, and a passivation layer 124 on an active surface of the first chip 100 is exposed. According to an embodiment, the lower insulating layer 120 may include an inter-metallic insulating layer 122, and a passivation layer 124. According to an embodiment, the first connecting members 140 may include a bump pad 142 and a bump 144.

The second chip 200 may include, similar to the first chip 100, a body layer 210, a lower insulating layer 220, and second connecting members 240. The second chip 200 may include no TSVs, According to another embodiment, the second chip 200 may include TSVs. An active surface of the second chip 200 may be mounted on an inactive surface of the first chip 100 to thereby constitute a chip stack. The second connecting members 240 may be connected to the first chip pads 170 of the first chip 100. Accordingly, the second chip 200 may be electrically connected to the TSVs 130 of the first chip 100 via the second connecting members 240. Each of the second connecting members 240 may include a second chip pad 242 and a bump 244. According to an embodiment, the lower insulating layer 220 may include an inter-metallic insulating layer 222 and a passivation layer 224.

The sealant 330 may fill a connecting portion between the first chip 100 and the second chip 200, that is, a portion where the first chip pads 170 of the first chip 100 are connected to the second connecting members 240. The sealant 330 may be formed of an underfill 310. The sealant 330 is formed to surround both lateral surfaces (LS1 and LS2) of the second chip 200. Accordingly, the sealant 330 formed on both lateral surfaces of the second chip 200 and the sealant 330 formed in the connecting portion between the first chip 100 and the second chip 200 may be formed of the same material.

An upper surface of the second chip 200 is exposed without being covered by the sealant 330. According to an embodiment, both lateral surfaces of the first chip 100 are not covered by a sealant (or an encapsulant) and are thus exposed. Accordingly, when the chip-stacked semiconductor package 1000 is mounted on a main chip or a board substrate and molded again, an additional molding material may be smoothly bonded and attached to the upper surface of the second chip 200 or the lateral surfaces of the first chip 100.

The chip-stacked semiconductor package 1000 (CSP3) may include a detection pad group MPD as described above. First chip pads 170 of the detection pad group MPD may include a first detection pad 170*a* and a second detection pad 170*b*. Second chip pads 242 of the detection pad group MPD may include a third detection pad 242*a* and a fourth detection pad 242*b*.

The first detection pad 170*a* and the third detection pad 242*a* are electrically and physically connected to each other by using a bump 244 being a medium unit ME. The second detection pad 170*b* and the fourth detection pad 242*b* are not physically connected to each other by the sealant 330 being a non-medium unit NME. A method of measuring a capacitance by using the detection pad group MPD and detecting a stacking accuracy and a joint gap according to the capacitance measurement has been described above and accordingly is omitted.

FIGS. 12A through 12G are cross-sectional views for explaining a method of manufacturing the chip-stacked semiconductor package 1000 of FIG. 11. FIGS. 12A through 12G are provided to explain a method of manufacturing the chip-stacked semiconductor package 1000 by using a CoW.

Figure 12A:
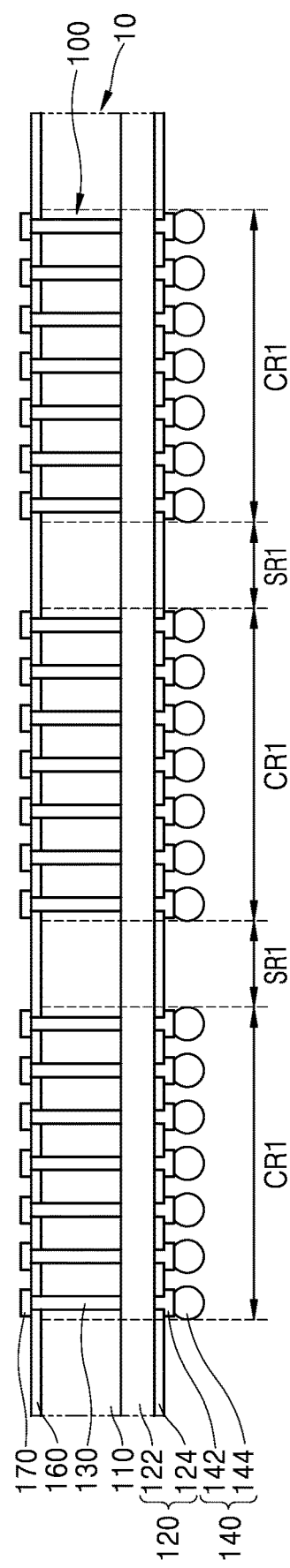
FIGS. 12A through 12G are cross-sectional views for explaining a method of manufacturing the chip-stacked semiconductor package of FIG. 11.

Referring to FIG. 12A, a base wafer 10 including a plurality of first chips 100 in which TSVs 130 are formed is prepared. The base wafer 10 is completed by simultaneously forming the first chips 100 including the TSVs 130 on a wafer level. In the base wafer 10, a size, for example, a length or width, of a chip region is indicated by CR1.

A size, for example, a length or width, of a scribe lane region between the first chips 100 is indicated by SR1. In FIG. 12A, for convenience of explanation, three first chips 100 are illustrated on the base wafer 10, but several tens to several hundreds of first chips 100 may be formed on the base wafer 10. As described above, the test terminal group TPD of FIG. 1, for example, the first test terminal 17 of FIG. 1 and the second test terminal 19 of FIG. 1, may be formed on the scribe lane region.

The base wafer 10 may include a body layer 110, a lower insulating layer 120, TSVs 130, first connecting members 140, a protective layer 160, and first chip pads 170. The body layer 110 may include a silicon substrate, an integrated circuit layer formed on the silicon substrate, and an inter-layer insulating layer covering the integrated circuit layer. The lower insulating layer 120 may be formed below the body layer 110, and may include an inter-metallic insulating layer 122, and a passivation layer 124. A multi-layered wiring pattern may be formed within the inter-metallic insulating layer 122.

The TSVs 130 may penetrate through the body layer 110 and may be connected to the multi-layered wiring pattern of the lower insulating layer 120. Each of the first connecting members 140 may include a bump pad 142 and a bump 144. The bump pads 142 may be formed of a conductive material on the passivation layer 124 and may be electrically connected to the multi-layered wiring pattern within the lower insulating layer 120. Accordingly, the bump pads 142 may be electrically connected to the TSVs 130 via the multi-layered wiring pattern. In other words, the first connecting members 140 may be electrically connected to respective one surfaces of the TSVs 130.

The bump pads 142 may be formed of aluminum (Al), copper (Cu), or the like, and may be formed by pulse plating or direct current plating. However, the bump pads 142 are not limited to the aforementioned materials or methods. The bumps 144 may be formed on the bump pads 142. The bumps 144 may be formed of a conductive material such as copper (Cu), aluminum (Al), gold (Au), or solder. However, the material of the bumps 144 is not limited thereto. When the bumps 144 are formed of solders, the bumps 144 may be referred to as solder bumps.

The protective layer 160 may be formed on an upper surface of the body layer 110, and may be formed of an insulative material to protect the body layer 110 from the outside. The protective layer 160 may be formed of an oxide layer, a nitride layer, or a double layer formed of an oxide layer and a nitride layer. The protective layer 160 may be formed of an oxide layer, for example, a silicon oxide (SiO2) layer, by high-density plasma chemical vapor deposition (HDP-CVD).

The first chip pads 170 may be formed on the protective layer 160 and may be electrically connected to the TSVs 130. In other words, the first chip pads 170 may be formed on the other surfaces of the TSVs 130 and may be electrically connected to the TSVs 130. The first chip pads 170 may be formed of Al, Cu, or the like, like the bump pads 142.

Figure 12B:
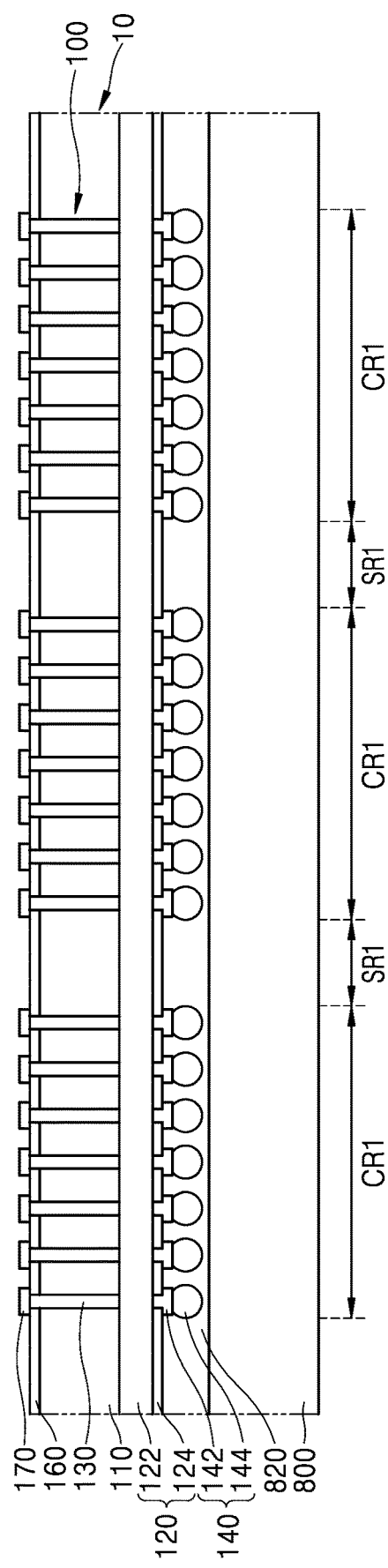

Referring to FIG. 12B, a supporting carrier 800 is prepared. An adhesion member 820 may be formed on the supporting carrier 800. The supporting carrier 800 may be formed of a silicon substrate, a germanium substrate, a silicon-germanium substrate, a gallium-arsenic (GaAs) substrate, a glass substrate, a plastic substrate, a ceramic substrate, or the like. According to the present embodiment, the supporting carrier 800 may be formed of a silicon substrate or a glass substrate. The adhesion member 820 may be formed of, for example, a non-conductive film (NCF), an anisotropic conductive film (ACF), a UV film, an instant adhesive, a thermosetting adhesive, a laser hardening adhesive, an ultrasonic hardening adhesive, or a non-conductive paste (NCP).

The base wafer 10 is adhered onto the supporting carrier 800 via the adhesion member 820. The base wafer 10 may be attached onto the supporting carrier 800 such that the first connecting members 140 face the supporting carrier 800. The supporting carrier 800 may be prepared before the base wafer 10 is prepared, or may be prepared after the base wafer 10 is prepared and before the base wafer 10 is attached onto the supporting carrier 800.

Figure 12C:
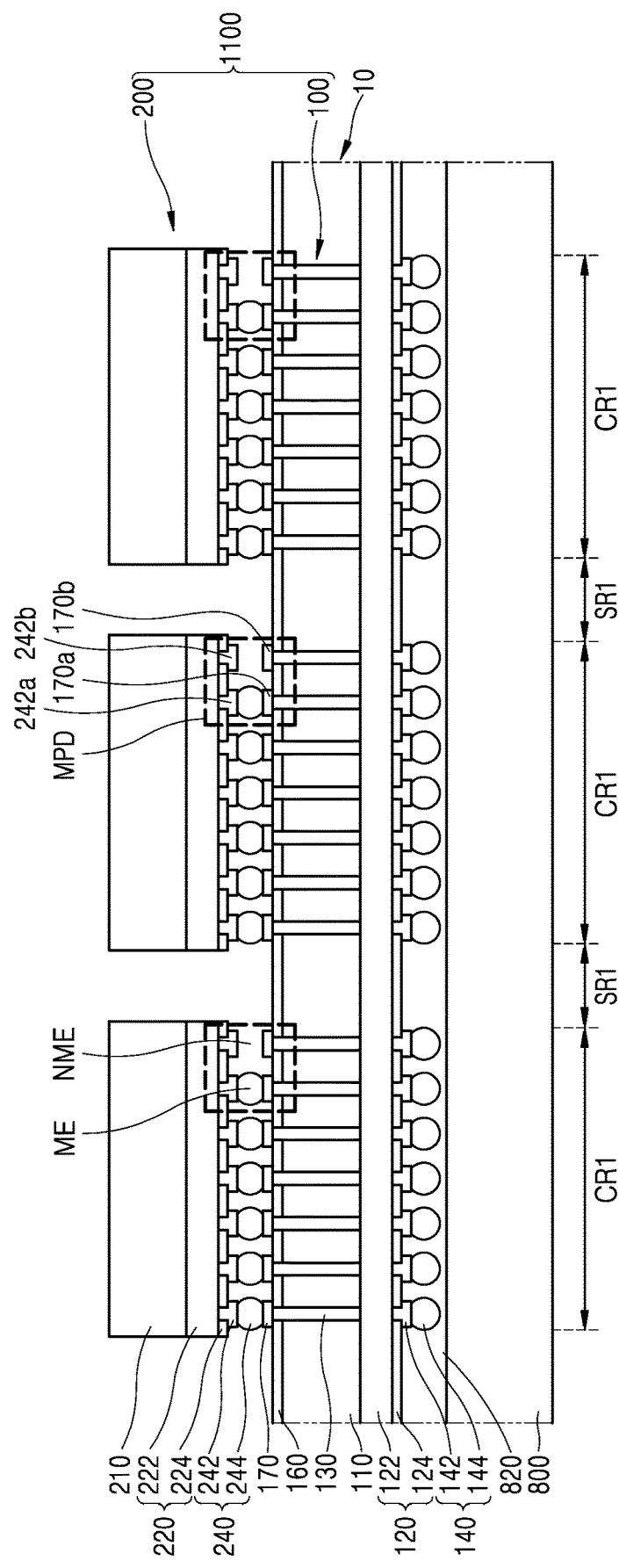

Referring to FIG. 12C, second chips 200 are prepared. Each of the second chips 200 may include a body layer 210, a lower insulating layer 220, and second connecting members 240. Similar to the first chips 100, the body layer 210 may include a silicon substrate, an integrated circuit layer formed on the silicon substrate, and an interlayer insulation layer covering the integrated circuit layer. An upper surface of the body layer 210 may be exposed to the outside. The upper surface of the body layer 210 may be a second surface of the silicon substrate that faces a first surface of the silicon substrate on which the integrated circuit layer is formed. Accordingly, silicon in the silicon substrate may be exposed to the outside. In some cases, as in the first chips 100, a protective layer may be formed on the second surface of the silicon substrate.

The lower insulating layer 220 may be formed below the body layer 210, and may include an inter-metallic insulating layer 222 and a passivation layer 224. A multi-layered wiring pattern may be formed within the inter-metallic insulating layer 222.

Each of the second connecting members 240 may include a second chip pad 242 and a bump 244. The second chip pads 242 may be formed of a conductive material on the passivation layer 224 and may be electrically connected to the multi-layered wiring pattern within the lower insulating layer 220. The second chip pads 242 may be formed of the same material as a material used to form the bump pads 142 of the first connecting members 140.

The bumps 244 may be formed on the second chip pads 242. The bumps 244 may be formed of a conductive material. Like the bumps 144 of the first connecting members 140, the bumps 244 may be formed of copper (Cu), aluminum (Al), gold (Au), solder, or the like. However, the material of the bumps 244 is not limited thereto. In contrast with the first chips 100, the second chips 200 may not include TSVs that penetrate through the body layers 210.

A chip stack 1100 is formed by stacking each of the second chips 200 on an upper surface of each of the first chips 100. The chip stacks 1100 may be formed by adhering the second connecting members 240 of the second chips 200 onto the first chip pads 170 of the first chips 100 by thermal compression. The second connecting members 240 may be connected to the first chip pads 170 of the first chips 100. Accordingly, multi-layered wiring patterns of the second chips 200 may be electrically connected to the TSVs 130 of the first chips 100 via the second connecting members 240.

When the second connecting members 240 of the second chips 200 are located to face the first chip pads 170 of the first chips 100, the second chips 200 may be stacked on the first chips 100. The second chips 200 may be a different kind of chips from the first chips 100. Alternatively, the second chips 200 may be the same kind of chips as the first chips 100.

According to an embodiment, the second chips 200 may be obtained by cutting the same base wafer as illustrated in FIG. 12A. At this time, no TSVs may be formed in the second chips 200. However, according to another embodiment, TSVs may be formed in the second chips 200. Accordingly, the second chips 200 may be chips separated and obtained from the same base wafer as that for the first chips 100.

When the chip stacks 1100 are formed by stacking the second chips 200 on the respective upper surfaces of the first chips 100, detection pad groups MPD are formed as described above. When each of the detection pad groups MPD are formed, the first detection pad 170a and the third detection pad 242a are electrically and physically connected to each other by using a bump 244, which is a medium unit ME, as described above. The second detection pad 170b and the fourth detection pad 242b are not physically connected to each other via a non-medium unit NME. The non-medium unit NME may be a portion corresponding to a sealant formed of an underfill or a molding material later.

After the chip stacks 1100 are formed by stacking the second chips 200 on the respective upper surfaces of the first chips 100, capacitances between the second detection pads 170b and the fourth detection pads 242b may be measured using test terminals located on the scribe lane regions of the first chips 100, as described above. The capacitances between the second detection pads 170b and the fourth detection pads 242b are measured on an in-line during a manufacturing process. Accordingly, the stacking accuracies between the first chips 100 and the second chips 200 and the joint gaps between the first chips 100 and the second chips 200 may be detected.

Figure 12D:
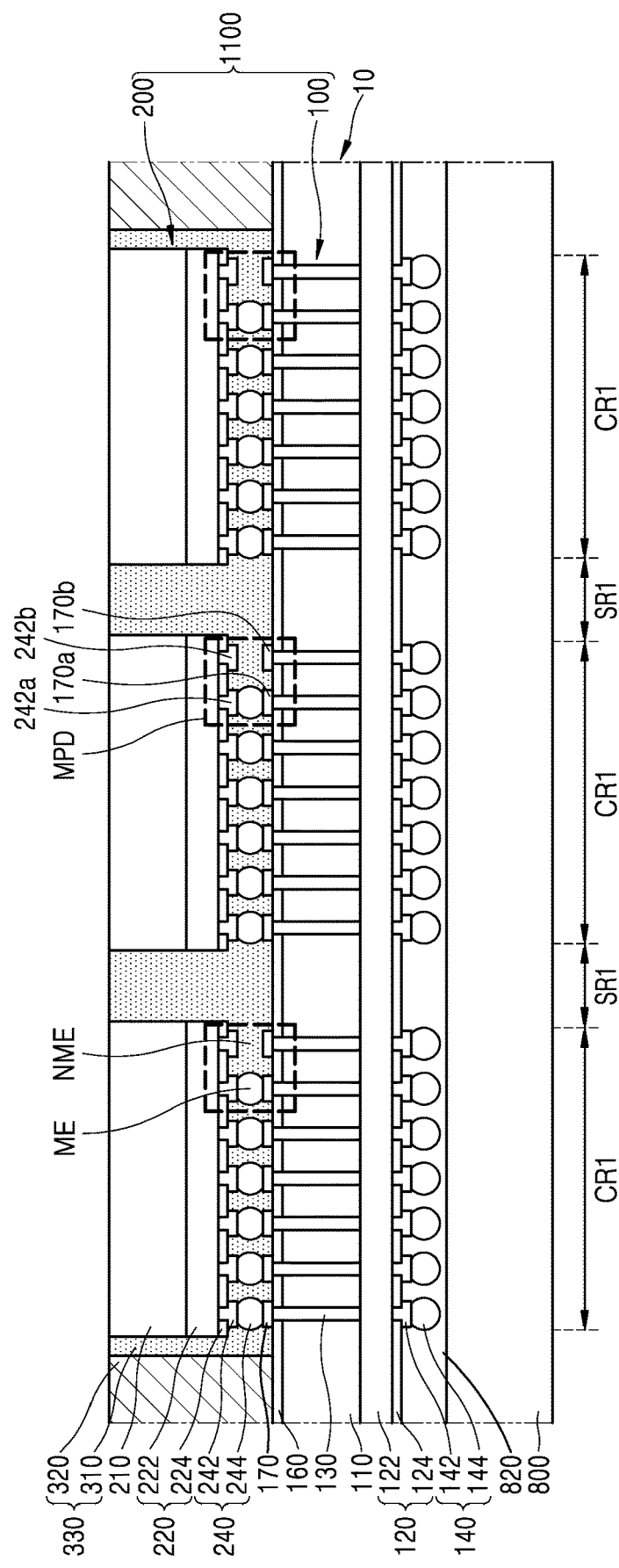

Referring to FIG. 12D, an underfill 310 is formed to fill a connecting portion between the first chip 100 and the second chip 200 of each of the chip stacks 1100. The underfill 310 may constitute the non-medium unit NME. The underfill 310 may fill the connecting portion between the first chip 100 and the second chip 200, that is, a portion where the first chip pads 170 of the first chip 100 are connected to the second connection members 240. The underfill 310 may be formed of underfill resin such as epoxy resin, and silica filler, flux, or the like may be included in the underfill 310. The underfill 310 may be formed of a material different from a molding material which will be formed later. However, the underfill 310 may be formed of the same material as the molding material.

The underfill 310 may fill only the connecting portion between the first chip 100 and the second chip 200. However, as shown in FIG. 12D, the underfill 310 may surround the lateral surfaces of the second chip 200 while filling the connecting portion between the first chip 100 and the second chip 200. An underfill process in the present operation may be omitted as necessary.

Moreover, a molding material 320 is formed to mold the chip stacks 1100 attached onto the supporting carrier 800. The molding material 320 may be formed of polymer such as resin. For example, the molding material 320 may be formed of an epoxy molding compound (EMC). Accordingly, a sealant 330 including the underfill 310 and the molding material 320 sealing the chip stacks 1100 is formed. The sealant 330 may sealant the lateral surfaces or upper surfaces of the first and second chips 100 and 200 of each of the chip stacks 1100. Due to existence of the underfill 310, the molding material 320 may sealant lateral surfaces of the underfill 310.

An upper surface of the sealant 330 may be ground to expose the upper surface of the second chip 200 of each of the chip stacks 1100. The upper surface of the sealant 330 may be on the same plane as the upper surface of the second chip 200. When no TSVs are formed in the second chip 200, the upper surface of the second chip 200 may be a second surface of a semiconductor substrate (i.e., a silicon substrate) having no integrated circuit layers thereon, and accordingly, silicon of the second surface of the semiconductor substrate may be exposed to the outside.

When the upper surfaces of the chip stacks 1100, namely, the second chips 200, are exposed and a chip-stacked semiconductor package that is completed later is mounted on a board substrate and molded, a molding material may be smoothly coupled and attached to the upper surfaces of the second chips 200.

Figure 12E:
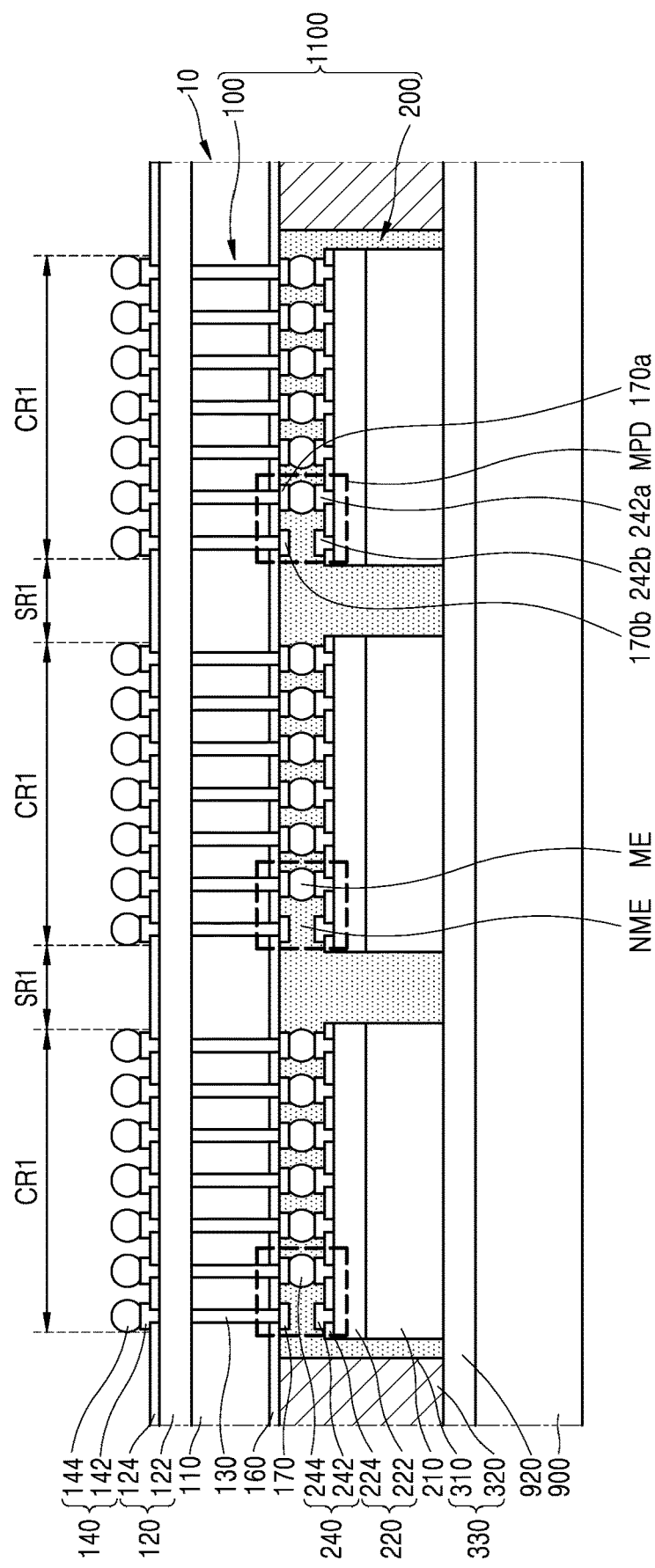

Referring to FIG. 12E, the first connecting members 140 of the first chips 100 of the chip stacks 1100 may be exposed to the outside by separating the supporting carrier 800 from the base wafer 10 and removing the adhesion member 820 from the base wafer 10 (constituting a body layer). Detection pads including chip pads may be formed on respective one surfaces of the first chips 100, and the first connecting members 140 may be formed on the respective other surfaces of the first chips 100.

The supporting carrier 800 and the adhesion member 820 may be separately removed. In some cases, the supporting carrier 800 and the adhesion member 820 may be simultaneously removed. For example, when the supporting carrier 800 is formed of a transparent material, for example, a glass substrate, and the adhesion member 820 is formed of an UV film, the supporting carrier 800 and the adhesion member 820 may be simultaneously separated from the base wafer 10 via UV radiation.

Next, the base wafer 10 including the chip stacks 1100 attached thereto is turned upside down, and then a support substrate 900 is attached to the base wafer 10. The support substrate 900 is attached to a second surface that faces a first surface thereof via which the first connecting members 140 of the first chips 100 are exposed, via an adhesion member 920. The support substrate 900 may be formed of, for example, a silicon substrate, a germanium substrate, a silicon-germanium substrate, a gallium-arsenic (GaAs) substrate, a glass substrate, a plastic substrate, or a ceramic substrate. The adhesion member 920 may be formed of, for example, an NCF, an ACF, a UV film, an instant adhesive, a thermosetting adhesive, a laser hardening adhesive, an ultrasonic hardening adhesive, or an NCP. According to the present embodiment, the support substrate 900 may be formed of a glass substrate, and the adhesion member 920 may be formed of a UV film.

Figure 12F:
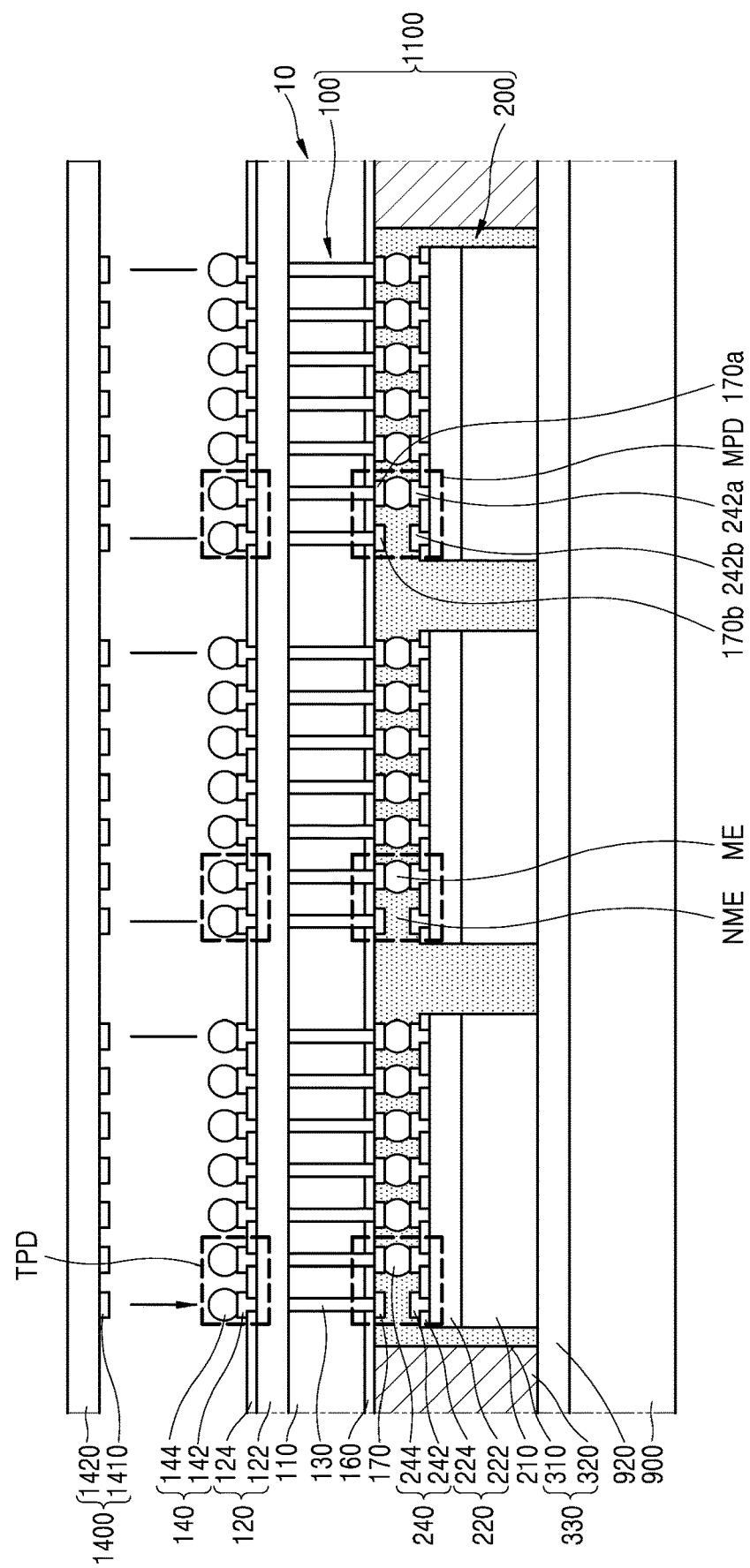

Referring to FIG. 12F, each of the chip stacks 1100 undergoes an electrical die sorting (EDS) test by using the support substrate 900. The EDS test may be performed using a probe card 1400 or the like. The probe card 1400 may include a body portion 1420 and terminal pins 1410. The terminal pins 1410 may be, for example, pogo pins. The pogo pins contact the corresponding first connecting members 140 and an electrical signal is applied to the first connecting members 140, so that an EDS test may be performed.

Furthermore, during the EDS test, the capacitance between the second detection pad 170b and the fourth detection pad 242b may be measured using the first connecting members 140. Because the first connecting members 140 include the bump pads 142 and the bumps 144, the bump pads 142 and the bumps 144 may serve as a test terminal. In other words, bump pads 142 and bumps 144 included in test terminal groups TPD may be formed on the other surfaces of the first chips 100, and may include a first test terminal and a second test terminal. Accordingly, the stacking accuracies between the first chips 100 and the second chips 200 and the joint gaps between the first chips 100 and the second chips 200 may be detected.

Through the EDS test or the capacitance measurement, it is determined whether the chip stacks 1100 are good or defective. As such, a determination as to whether the chip stacks 1100 are good or defective is made through the EDS test, and chip stacks 1100 determined to be defective are discarded. Accordingly, a final chip-stacked semiconductor package 1000 according to the present embodiment is a package where chips having passed the EDS test are stacked. Thus, the final chip-stacked semiconductor package 1000 according to the present embodiment may be referred to as a Known Good Die Stack (KGDS) package.

Figure 12G:
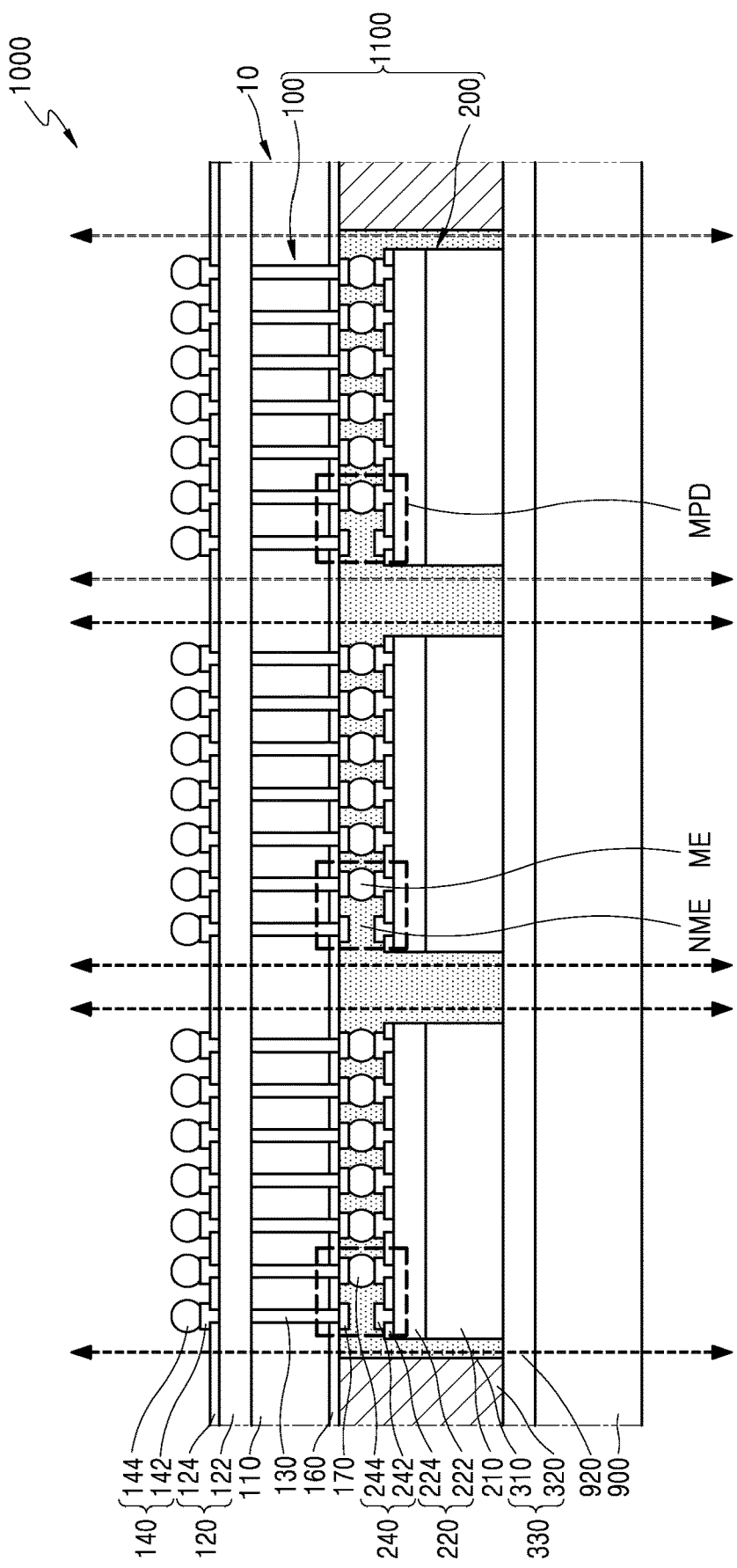

Referring to FIG. 12G, chip-stacked semiconductor packages 1000 are obtained by sawing (cutting) the base wafer 10 and the sealant 330. The adhesion member 920 may be partially removed by sawing.

Next, the chip-stacked semiconductor packages 1000 are completed by removing the support substrate 900 and the adhesion member 920. The support substrate 900 and the adhesion member 920 may be removed sequentially or simultaneously. After the chip-stacked semiconductor packages 1000 are formed by cutting as described above, both lateral surfaces of the first chips 100 are exposed. Accordingly, when the chip-stacked semiconductor packages 1000 are mounted on a board substrate and molded again, an additional molding material may be smoothly coupled and attached to the lateral surfaces of the first chips 100.

Figure 13:
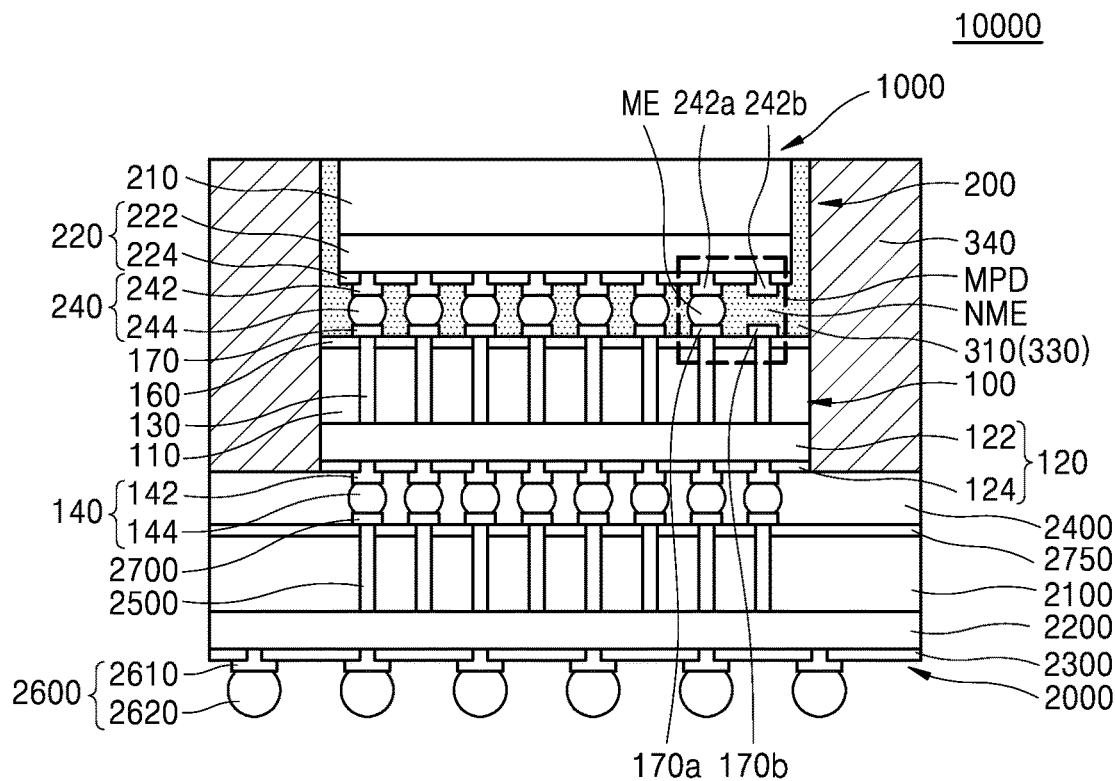
FIGS. 13 and 14 are cross-sectional views of semiconductor package systems respectively including chip-stacked semiconductor packages according to an embodiment of the inventive concept.
Figure 14:
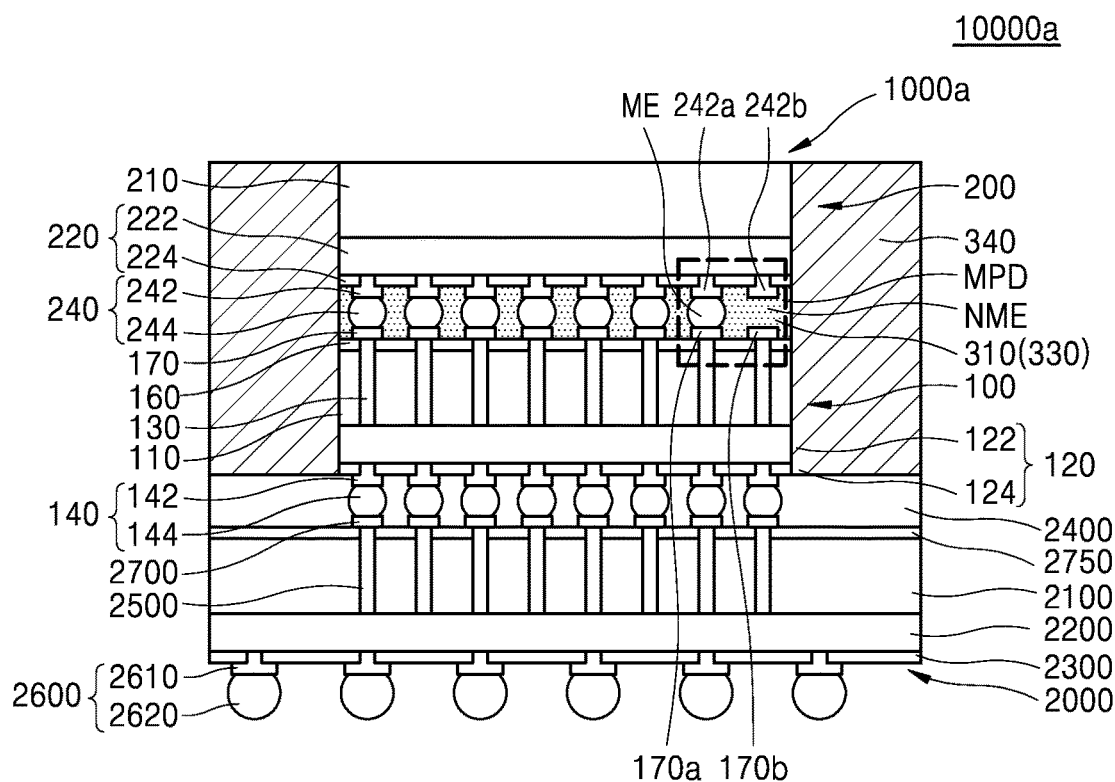

FIGS. 13 and 14 are cross-sectional views of semiconductor package systems 10000 and 10000a respectively including chip-stacked semiconductor packages according to an embodiment of the inventive concept.

In detail, the semiconductor package systems 10000 and 10000a according to an embodiment may include a main chip 2000 and chip-stacked semiconductor packages 1000 and 1000a, respectively. The chip-stacked semiconductor package 1000 may be the same as the chip-stacked semiconductor package 1000 of FIG. 11. The chip-stacked semiconductor package 1000a may be the same as the chip-stacked semiconductor package 1000 except that a second sealant 340 is formed in contact with both lateral surfaces of the second chip 200. That is, in FIG. 14, the first sealant 330 is not formed in contact with both lateral surfaces of the second chip 200. The chip-stacked semiconductor packages 1000 and 1000a may include detection pad groups MPD, respectively. Accordingly, the respective components of the chip-stacked semiconductor packages 1000 and 1000a will not be described or briefly described.

Each of the chip-stacked semiconductor packages 1000 and 1000a is stacked on the main chip 2000. Each of the chip-stacked semiconductor packages 1000 and 1000a is sealed by the second sealant 340, The main chip 2000 may be larger than the first and second chips 100 and 200. Each of the chip-stacked semiconductor packages 1000 and 1000a may be mounted on the main chip 2000 via an adhesion member 2400. Accordingly, a lower surface of the second sealant 340 may be adhered to a portion of the adhesion member 2400 that is located on an outer portion of the main chip 2000.

Similar to a memory chip, the main chip 2000 may include a body layer 2100, a lower insulating layer 2200, a passivation layer 2300, TSVs 2500, third connecting members 2600, a protective layer 2750, and main chip pads 2700. The lower insulation layer 2200 and the passivation layer 2300 may include different integrated circuit layers and different multi-layered wiring patterns according to the types of main chips. The main chip 2000 may be a logic chip, for example, a central processing unit (CPU), a controller, or an application specific integrated circuit (ASIC).

The number of TSVs 2500 and the number of main chip pads 2700 may be the same as the number of first connecting members 140 of the first chip 100 of each of the chip-stacked semiconductor packages 1000 and 1000a respectively stacked on the main chips 2000. In some cases, the number of TSVs 2500 and the number of main chip pads 2700 may be different from the number of first connecting members 140. For example, more TSVs 2500 may be formed than the first connecting members 140.

Each of the third connecting members 2600 formed on a lower surface of the main chip 2000 may include a bump pad 2610 and a bump 2620. The number of third connecting members 2600 may be less than the number of TSVs 2500. Accordingly, a TSV 2500 having no corresponding third connecting members 2600 may be connected to a third connecting member 2600 already occupied by another TSV 2500, via the multi-layered wiring patterns.

Each of the third connecting members 2600 formed on the main chip 2000 may be larger than each of the first connecting members 140, because wiring having the main chip 2000 mounted thereon and formed on a board substrate is standardized or it is difficult to densify the wring due to the physical characteristics (for example, plastic) of the board substrate. For this reason, all of the TSVs 2500 may not correspond to all of the third connecting members 2600, respectively.

Figure 15:
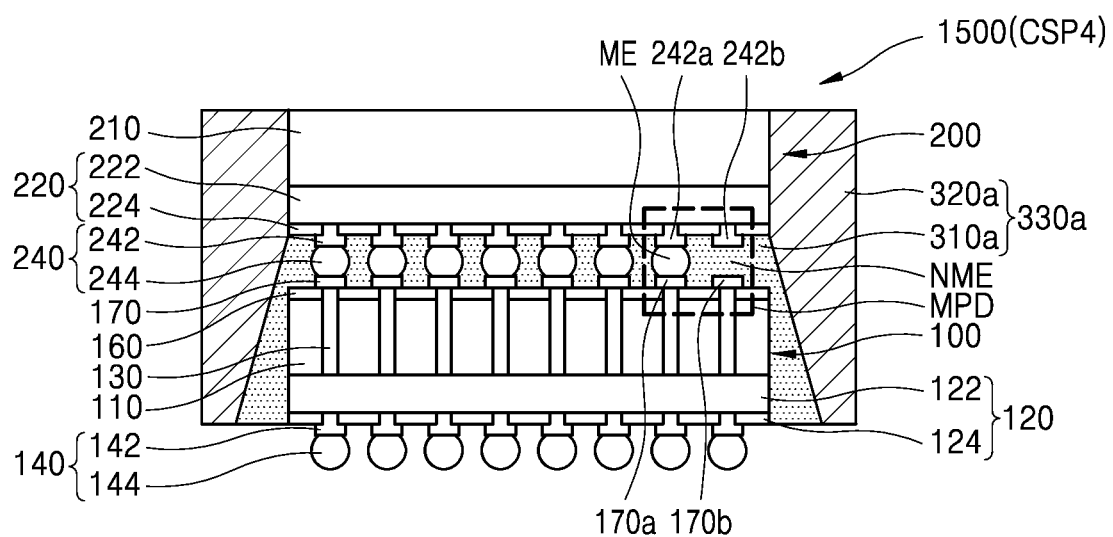
FIGS. 15 and 16 are cross-sectional views of chip-stacked semiconductor packages according to an embodiment of the inventive concept.
Figure 16:
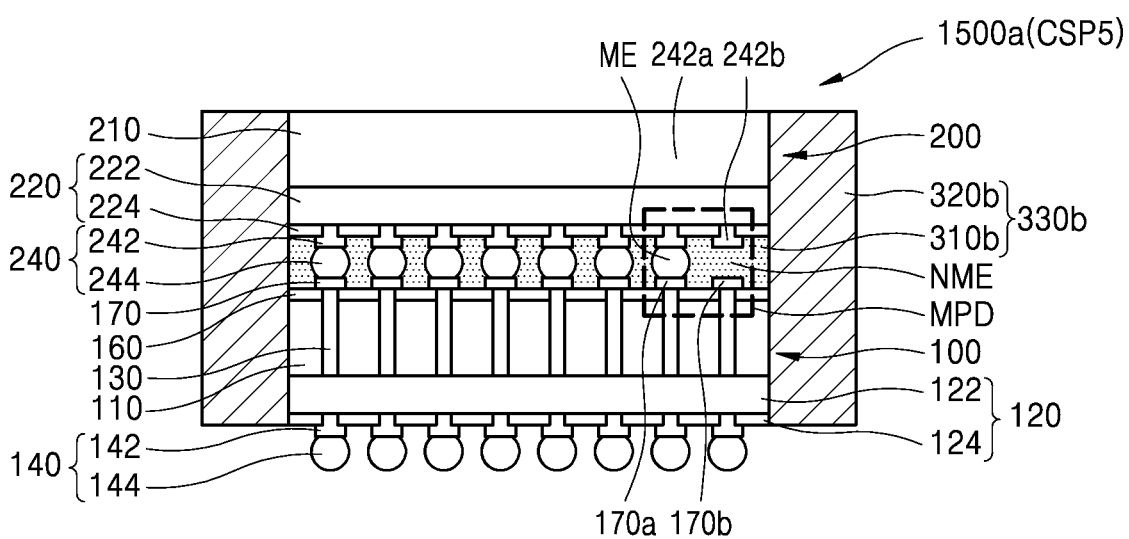

FIGS. 15 and 16 are cross-sectional views of chip-stacked semiconductor packages 1500(CSP4) and 1500a(CSP5) according to an embodiment of the inventive concept.

In detail, the chip-stacked semiconductor packages 1500(CSP4) and 1500a(CSP5) may be packages manufactured by a Chip on Chip (CoC). The chip-stacked semiconductor packages 1500 and 1500a may include a first chip 100, a second chip 200, and sealants 330a and 330b, respectively. The first chip 100 may include a body layer 110, a lower insulating layer 120, TSVs 130, first connecting members 140, a protective layer 160, and first chip pads 170. Bumps 144 are exposed through the bottom of the first chip 100, and a passivation layer 124 on an active surface of the first chip 100 is exposed.

The second chip 200 may include, similar to the first chip 100, a body layer 210, a lower insulating layer 220, and second connecting members 240. Each of the second connecting members 240 may include a second chip pad 242 and a bump 244. The second chip 200 may include no TSVs or, in some cases, may include TSVs. An active surface of the second chip 200 is mounted on an inactive surface of the first chip 100 to thereby constitute a chip stack, and second connecting pads 250 may be connected to the first chip pads 170 of the first chip 100. Accordingly, the second chip 200 may be electrically connected to the TSVs 130 of the first chip 100 via the second connecting members 240.

An underfill 310a of the chip-stacked semiconductor package 1500(CSP4) may fill a connecting portion between the first chip 100 and the second chip 200, that is, a portion where the first chip pads 170 of the first chip 100 are connected to the second connecting members 240. Furthermore, the underfill 310a is formed to surround both lateral surfaces of the first chip 100. A molding material 320a is formed on the underfill 310a, and the underfill 310a and the molding material 320a constitute a sealant 330a.

An underfill 310b of the chip-stacked semiconductor package 1500a(CSP5) may fill a connecting portion between the first chip 100 and the second chip 200, that is, a portion where the first chip pads 170 of the first chip 100 are connected to the second connecting members 240. A molding material 320b is formed on the underfill 310b, and the underfill 310b and the molding material 320b constitute a sealant 330b. Respective upper surfaces of the second chips 200 that respectively constitute the chip-stacked semiconductor packages 1500 and 1500a are exposed without being covered by the sealants 330a and 330b, respectively.

Each of the chip-stacked semiconductor packages 1500 and 1500a may include a detection pad group MPD as described above. Because the detection pad group MPD has been described above with reference to FIG. 11, a description thereof will be omitted.

FIGS. 17A through 17G are cross-sectional views for explaining a method of manufacturing the chip-stacked semiconductor package 1500 of FIG. 15. FIGS. 17A through 17G are provided to explain a method of manufacturing the chip-stacked semiconductor package 1500 by using a CoC.

Referring to FIG. 17A, a base wafer 10 including a plurality of chips in each of which a plurality of TSVs 130 are formed is prepared. The base wafer 10 adhered onto a support substrate 900 via an adhesion member 920 may be prepared.

The support substrate 900 may be formed of a silicon substrate, a germanium substrate, a silicon-germanium substrate, a gallium-arsenic (GaAs) substrate, a glass substrate, a plastic substrate, a ceramic substrate, or the like. The adhesion member 920 may be, for example, an NCF, an ACF, an instant adhesive, a thermosetting adhesive, a laser hardening adhesive, an ultrasonic hardening adhesive, or an NCP. As illustrated in FIG. 17A, the base wafer 10 may be adhered to the support substrate 900 such that first connecting members 140 face the support substrate 900. The base wafer 10 may be prepared by forming a plurality of chips each including TSVs on a wafer level.

Next, the plurality of chips are obtained by sawing the base wafer 10 along scribe lane regions. Each of the plurality of chips may correspond to the first chip 100 of the chip-stacked semiconductor package 1500 of FIG. 15. Accordingly, for convenience of explanation, chips obtained from a base wafer are hereinafter referred to as "a first chip" or "first chips". In FIG. 17A, S1 indicates a cut portion obtained by sawing.

Sawing may be performed only on the base wafer 10 and may not be performed on the support substrate 900 existing below the base wafer 10. As shown in FIG. 17A, a certain portion of the adhesion member 920 may be removed by sawing. After the first chips 100 are obtained from the base wafer 10, the support substrate 900 may be removed. While the support substrate 900 is being removed, the adhesion member 920 may be removed from the first chips 100, but the adhesion member 920 may not be removed from the first chips 100.

Figure 17B:
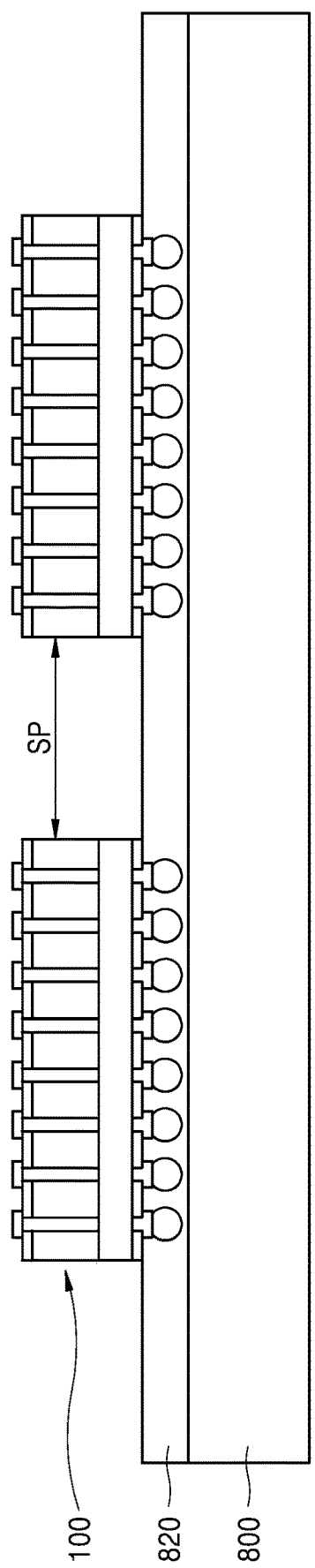

Referring to FIG. 17B, a supporting carrier 800 is prepared. An adhesion member 820 may be formed on the supporting carrier 800. The supporting carrier 800 may be formed of a silicon substrate, a germanium substrate, a silicon-germanium substrate, a gallium-arsenic (GaAs) substrate, a glass substrate, a plastic substrate, a ceramic substrate, or the like. According to the present embodiment, the supporting carrier 800 may be formed of a silicon substrate or a glass substrate. The adhesion member 820 may be, for example, an NCF, an ACF, a UV film, an instant adhesive, a thermosetting adhesive, a laser hardening adhesive, an ultrasonic hardening adhesive, or an NCP.

Next, the first chips 100 are adhered onto the supporting carrier 800 via the adhesion member 820. The first chips 100 may be attached onto the supporting carrier 800 such that the first connecting members 140 face the supporting carrier 800. Before the first chips 100 are adhered to the supporting carrier 800, the adhesion member 820 adhered to the respective lower surfaces of the first chips 100 may be removed.

The first chips 100 may be arranged at intervals of a specific distance SP on the supporting substrate 800 and attached onto the supporting substrate 800. According to an embodiment, the specific distance SP may be predetermined. The predetermined distance SP may be suitably determined in consideration of the size of the chip-stacked semiconductor package 1500 which is to be finally formed.

Figure 17C:
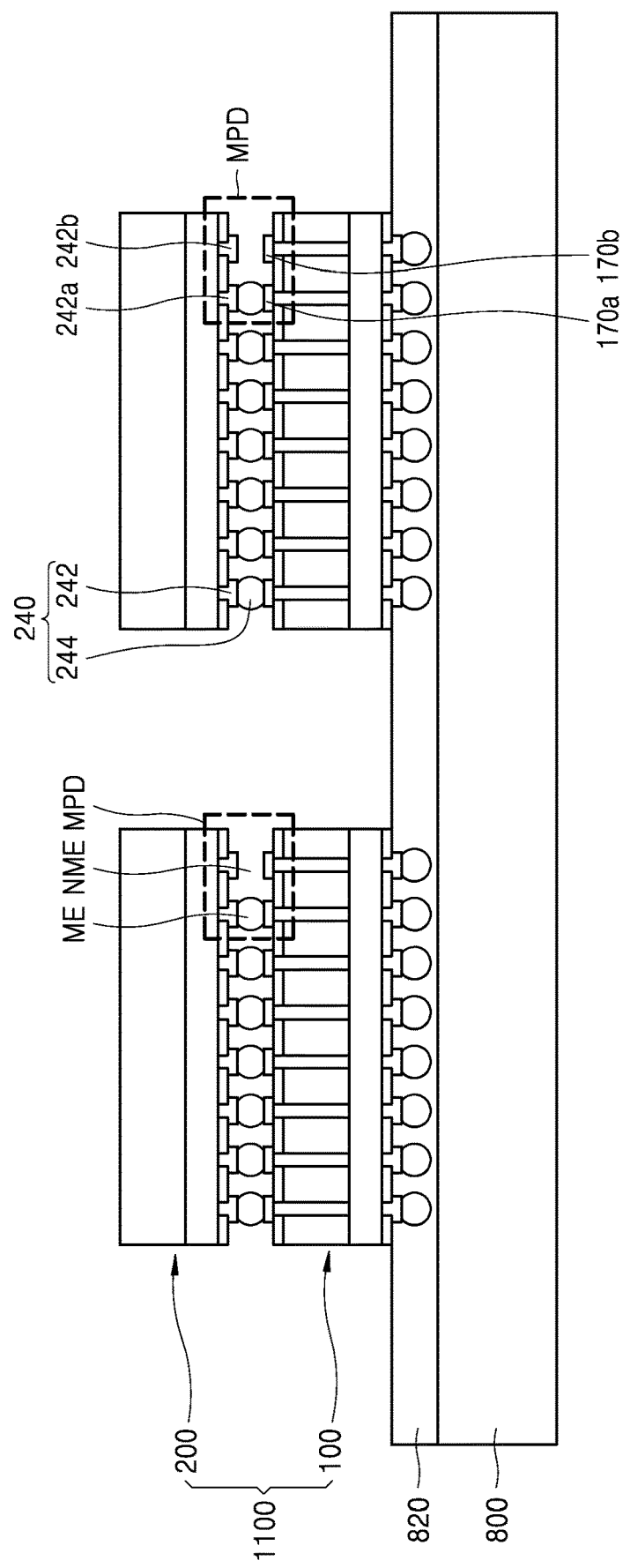

Referring to FIG. 17C, a chip stack 1100 is formed by stacking a second chip 200 on an upper surface of each of the first chips 100. The stacking may be performed by adhering the second connecting members 240 of the second chips 200 onto the first chip pads 170 of the first chips 100 by thermal compression.

The second chips 200 may also be obtained by cutting a base wafer, and no TSVs may be formed in the second chips 200. However, TSVs may be formed in the second chips 200. Accordingly, the second chips 200 may be chips separated and obtained from the same base wafer as that for the first chips 100.

As described above with reference to FIG. 12C, when the chip stacks 1100 are formed by stacking the second chips 200 on the respective upper surfaces of the first chips 100, detection pad groups MPD are formed. When each of the detection pad groups MPD are formed, the first detection pad 170a and the third detection pad 242a are electrically and physically connected to each other by using a bump 244, which is a medium unit ME, as described above. The second detection pad 170b and the fourth detection pad 242b are not physically connected to each other via a non-medium unit NME. The non-medium unit NME may be a portion corresponding to a sealant formed of an underfill or a molding material later.

After the chip stacks 1100 are formed by stacking the second chips 200 on the respective upper surfaces of the first chips 100, capacitances between the second detection pads 170b and the fourth detection pads 242b may be measured using test terminals located on the scribe lane regions of the first chips 100, as described above. The capacitances between the second detection pads 170b and the fourth detection pads 242b are measured on an in-line during a manufacturing process. Accordingly, the stacking accuracies between the first chips 100 and the second chips 200 and the joint gaps between the first chips 100 and the second chips 200 may be detected.

Figure 17D:
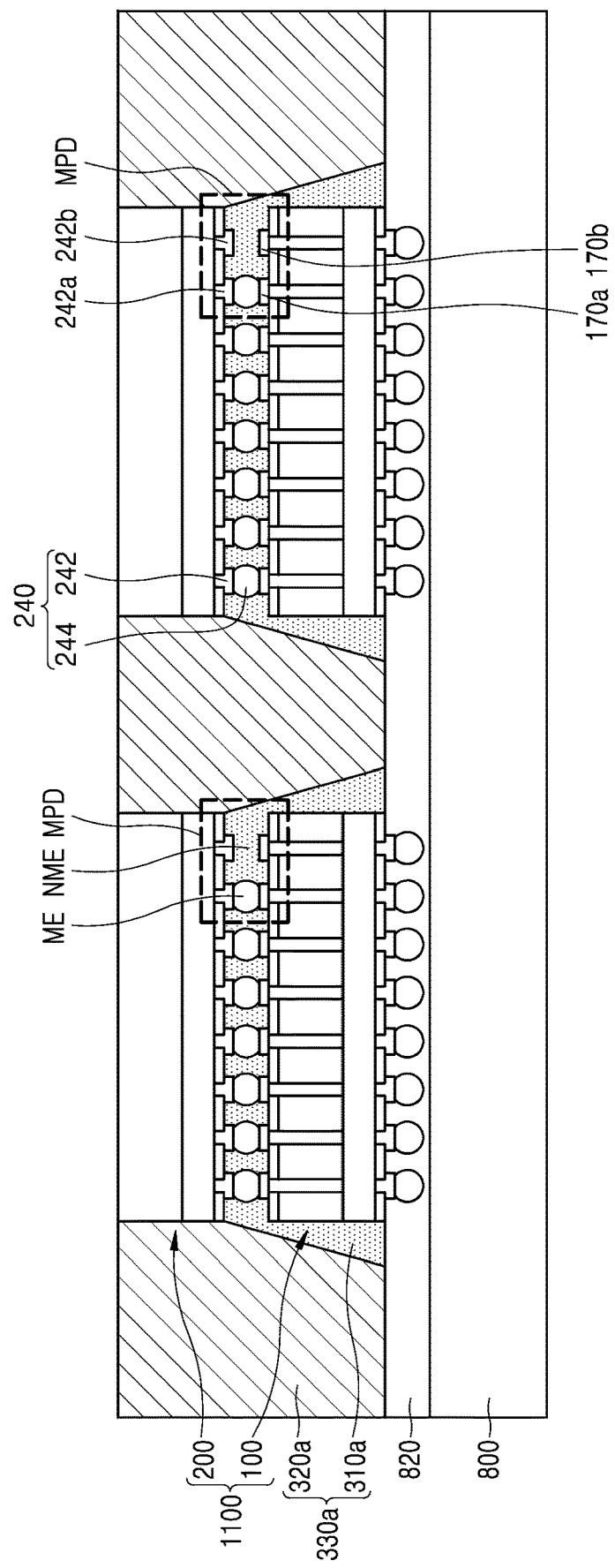

Referring to FIG. 17D, an underfill 310a is formed to fill a connecting portion between the first chip 100 and the second chip 200 of each of the chip stacks 1100. The underfill 310a may constitute the non-medium unit NME. The underfill 310a may fill only the connecting portion between the first chip 100 and the second chip 200. However, as shown in FIG. 17D, the underfill 310a may surround the lateral surfaces of the second chip 200 while filling the connecting portion between the first chip 100 and the second chip 200.

When the underfill 310a surrounds the first chip 100, the underfill 310a may be formed a predetermined distance apart from an underfill surrounding the first chip 100 of another chip stack. However, the underfill 310a may be formed to overlap the adjacent underfill.

According to the present embodiment, the underfill 310a may have a shape that widens downwards, but the shape of the underfill 310a is not limited thereto and may vary. For example, the underfill 310a may have a shape in which upper and lower portions have almost the same sizes. An underfill process in the present operation may be omitted.

Continuously, a molding material 320a is formed to mold the chip stacks 1100 attached onto the supporting carrier 800. The molding material 320a may be formed of polymer such as resin. For example, the molding material 320a may be formed of an Epoxy Molding Compound (EMC). Accordingly, a sealant 330a including the underfill 310a and the molding material 320a sealing the chip stacks 1100 is formed. The sealant 330a may sealant the lateral surfaces or upper surfaces of the first and second chips 100 and 200 of each of the chip stacks 1100. Due to existence of the underfill 310*a*, the molding material 320*a* may sealant lateral surfaces of the underfill 310*a*.

An upper surface of the sealant 330*a* may be ground to expose the upper surface of the second chip 200 of each of the chip stacks 1100. When no TSVs are formed in the second chip 200, the upper surface of the second chip 200 may be a second surface of a semiconductor substrate having no integrated circuit layers thereon, and accordingly, silicon of the second surface of the semiconductor substrate may be exposed to the outside.

Figure 17E:
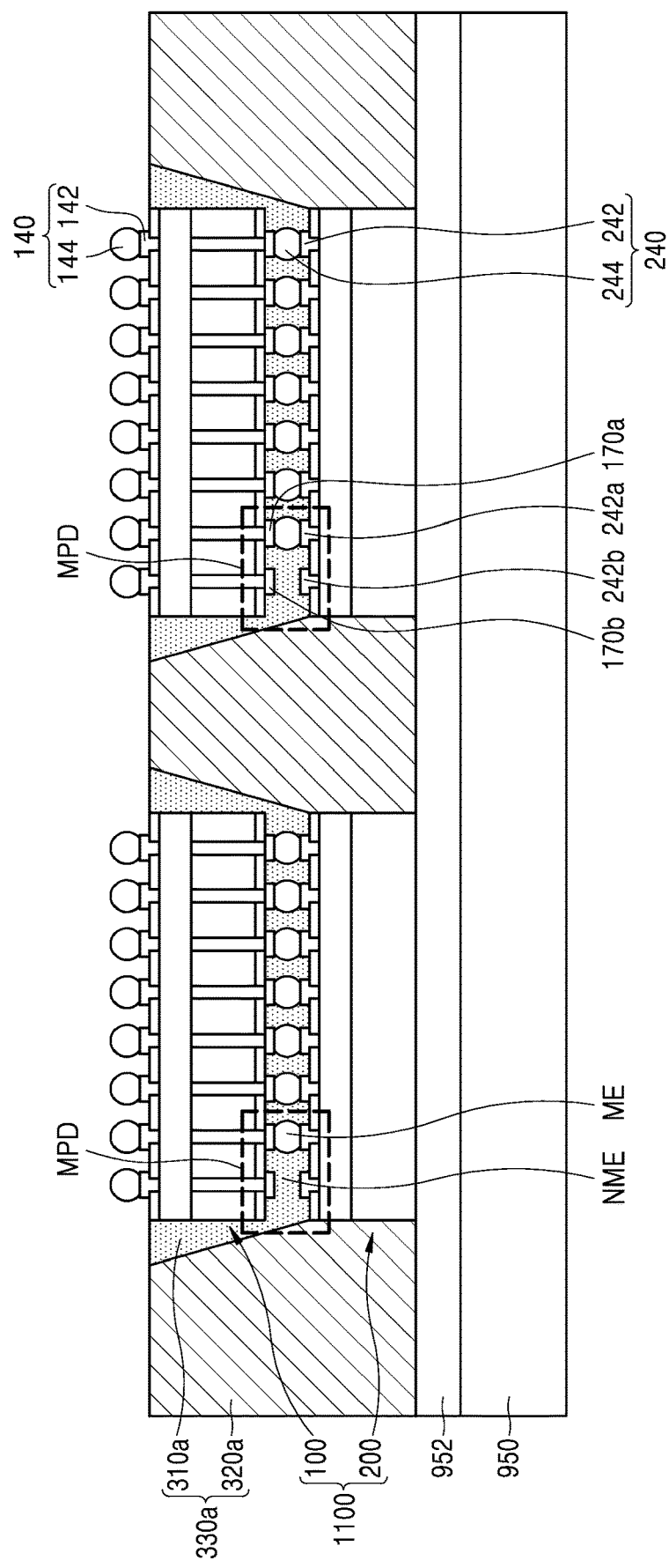

Referring to FIG. 17E, the supporting carrier 800 is separated from the chip stacks 1100, and the adhesion member 820 is removed. After this separation and removal, the first connecting members 140 of the first chip 100 of each of the chip stacks 1100 may be exposed to the outside. A lower surface of the sealant 330*a* and a lower surface of the first chip 100 may constitute a horizontal plane, and accordingly, the first connecting members 140 of the first chip 100 may be exposed by protruding from the horizontal plane.

Next, a support substrate 950 is attached to a second surface of each of the chip stacks 1100, namely, a second surface of each of the first chips 100 that faces a first surface thereof via which the first connecting members 140 are exposed, via an adhesion member 952. The support substrate 950 may be formed of, for example, a silicon substrate, a germanium substrate, a silicon-germanium substrate, a gallium-arsenic (GaAs) substrate, a glass substrate, a plastic substrate, or a ceramic substrate. The adhesion member 952 may be formed of, for example, an NCF, an ACF, a UV film, an instant adhesive, a thermosetting adhesive, a laser hardening adhesive, an ultrasonic hardening adhesive, or an NCP. According to the present embodiment, the support substrate 950 may be formed of a glass substrate, and the adhesion member 920 may be formed of a UV film.

Figure 17F:
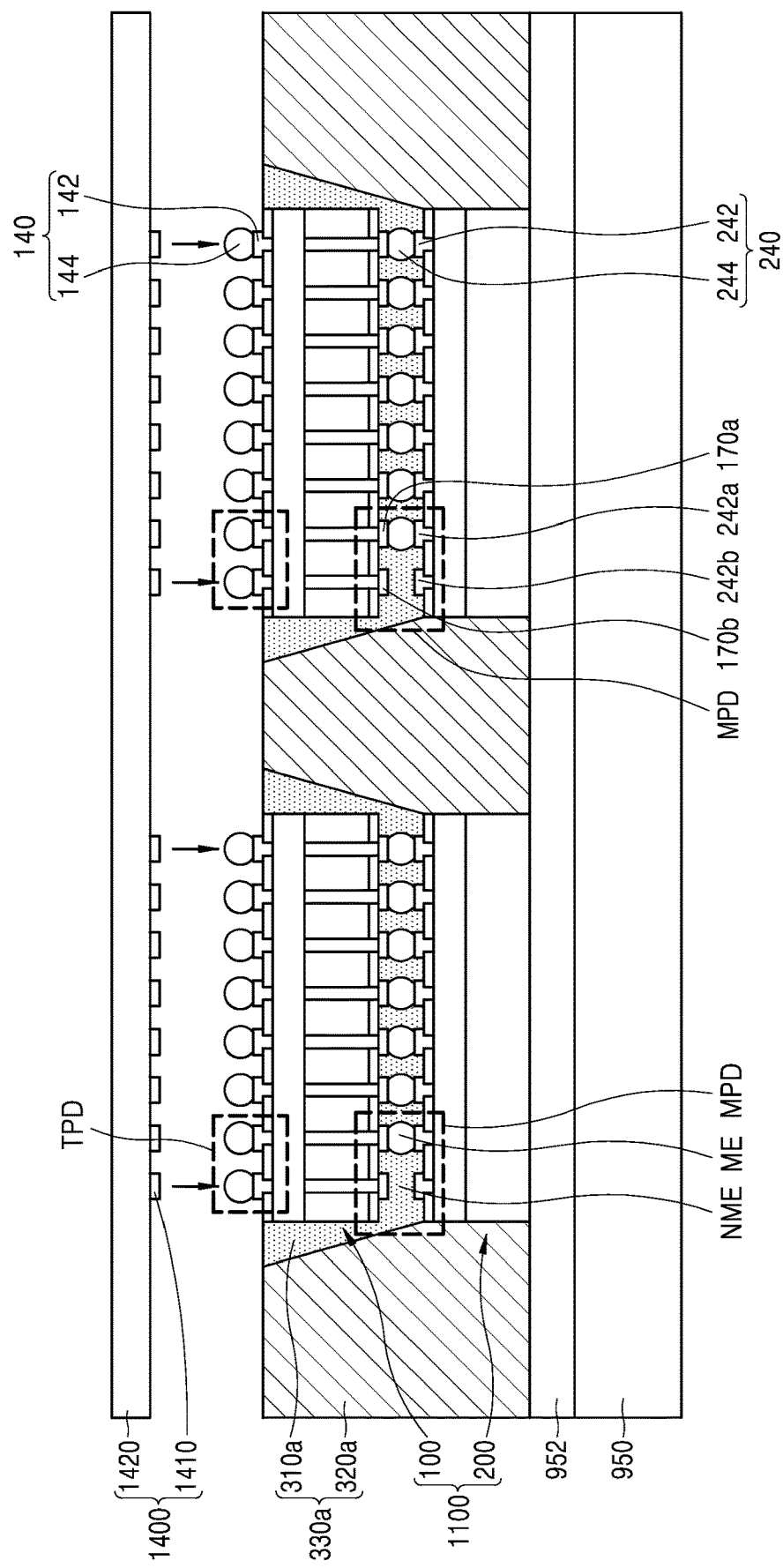

Referring to FIG. 17F, each of the chip stacks 1100 undergoes an EDS test by using the support substrate 950. The EDS test may be performed using a probe card 1400 or the like. The probe card 1400 may include a body portion 1420 and terminal pins 1410. The terminal pins 1510 may be, for example, pogo pins. The pogo pins contact the corresponding first connecting members 140 and an electrical signal is applied to the first connecting members 140, so that an EDS test may be performed.

Furthermore, during the EDS test, the capacitance between the second detection pad 170*b* and the fourth detection pad 242*b* may be measured using the first connecting members 140. Accordingly, the stacking accuracies between the first chips 100 and the second chips 200 and the joint gaps between the first chips 100 and the second chips 200 may be detected.

Through the EDS test or the capacitance measurement, it is determined whether the chip stacks 1100 are good or defective. As such, a determination as to whether the chip stacks 1100 are good or defective is made through the EDS test, and chip stacks 1100 or semiconductor packages 1000 determined to be defective are discarded. Accordingly, the chip-stacked semiconductor package 1500 according to the present embodiment is a package where chips having passed the EDS test are stacked. Accordingly, the chip-stacked semiconductor package 1500 according to the present embodiment may be referred to as a KGDS package.

Referring to FIG. 17G, chip-stacked semiconductor packages 1500 are obtained by sawing portions of the sealant 330*a* between the chip stacks 1100. The sawing is performed on only the portions of the sealant 330*a* between the chip stacks 1100. The adhesion member 952 may be partially removed by sawing. In FIG. 17G, S2 indicates a cut portion obtained by sawing.

Next, the chip-stacked semiconductor packages 1500 are completed by removing the support substrate 950 and the adhesion member 952. The support substrate 950 and the adhesion member 952 may be removed sequentially or simultaneously.

Figure 18:
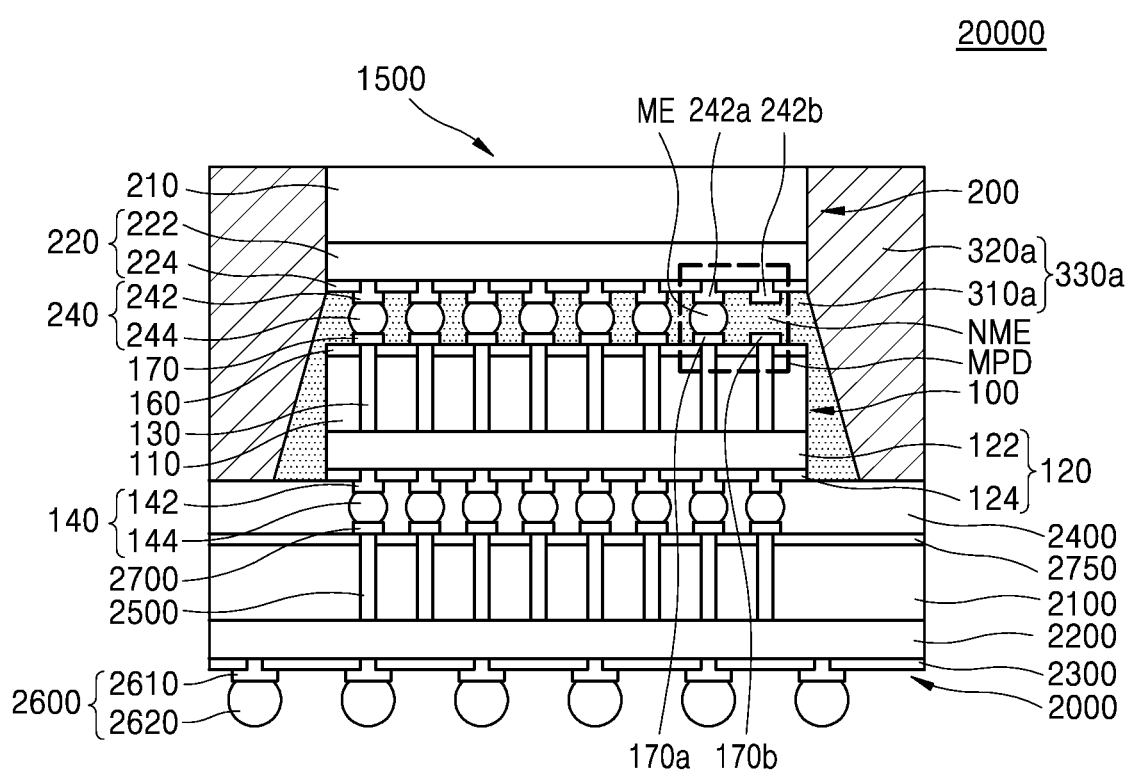
FIGS. 18 and 19 are cross-sectional views of semiconductor package systems according to an embodiment of the inventive concept.
Figure 19:
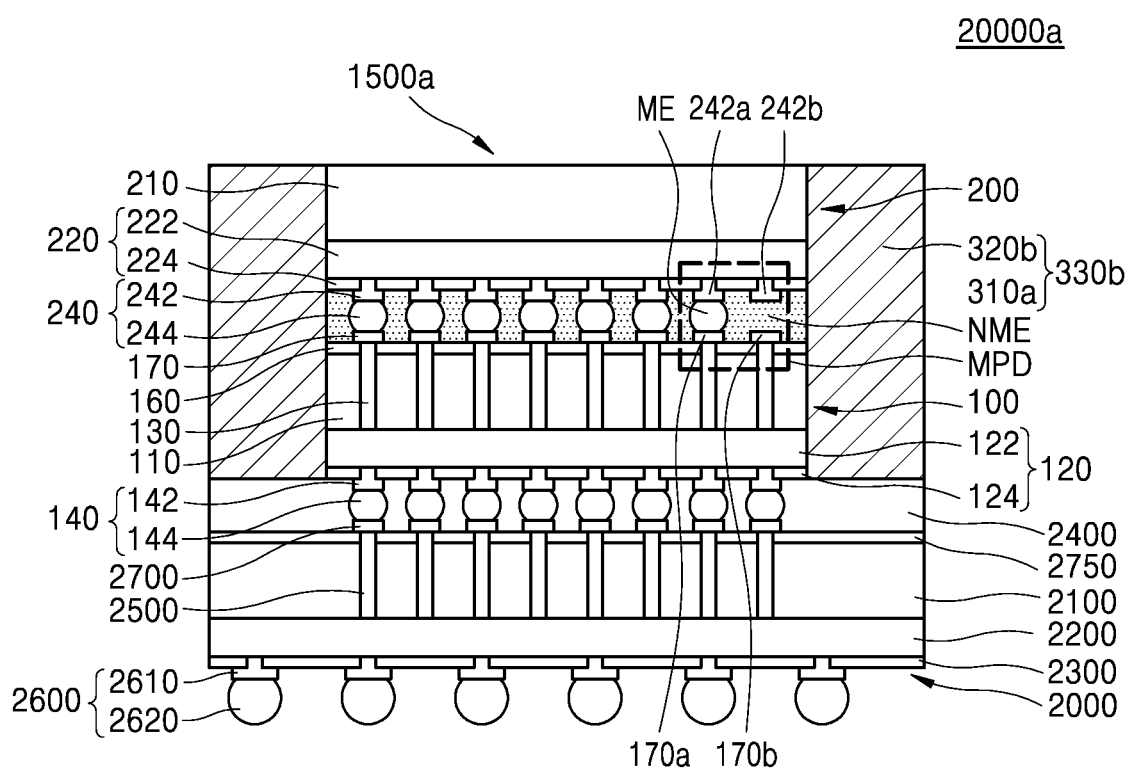

FIGS. 18 and 19 are cross-sectional views of semiconductor package systems 20000 and 20000*a* according to an embodiment of the inventive concept.

In detail, the semiconductor package systems 20000 and 20000*a* according to the present embodiment may include a main chip 2000 and chip-stacked semiconductor packages 1500 and 1500*a*, respectively. The chip-stacked semiconductor package 1500 may be the same as the chip-stacked semiconductor package 1500 of FIG. 15. The chip-stacked semiconductor package 1500*a* may be the same as the chip-stacked semiconductor package 1500 except that a sealant 330*b* including a molding material 320*b* is formed in contact with both lateral surfaces of a first chip 100. Accordingly, the respective components of the chip-stacked semiconductor packages 1500 and 1500*a* will not be described or briefly described.

Each of the chip-stacked semiconductor packages 1500 and 1500*a* is stacked on the main chip 2000. The chip-stacked semiconductor packages 1500 and 1500*a* are sealed by the sealants 330*a* and 330*b*. The main chip 2000 may be larger than the first and second chips 100 and 200. Each of the chip-stacked semiconductor packages 1500 and 1500*a* may be mounted on the main chip 2000 via an adhesion member 2400. Accordingly, a lower surface of each of the sealants 330*a* and 330*b* may be adhered to a portion of the adhesion member 2400 that is located on an outer portion of the main chip 2000.

Similar to a memory chip, the main chip 2000 may include a body layer 2100, a lower insulating layer 2200, a passivation layer 2300, TSVs 2500, third connecting members 2600, a protective layer 2750, and main chip pads 2700. The lower insulation layer 2200 and the passivation layer 2300 may include different integrated circuit layers and different multi-layered wiring patterns according to the types of main chips. The main chip 2000 may be a logic chip, for example, a CPU, a controller, or an ASIC.

The number of TSVs 2500 and the number of main chip pads 2700 may be the same as the number of first connecting members 140 of the first chip 100 of each of the chip-stacked semiconductor packages 1500 and 1500*a* respectively stacked on the main chips 2000. In some cases, the number of TSVs 2500 and the number of main chip pads 2700 may be different from the number of first connecting members 140. For example, more TSVs 2500 may be formed than the first connecting members 140.

Each of the third connecting members 2600 formed on a lower surface of the main chip 2000 may include a bump pad 2610 and a bump 2620. The number of third connecting members 2600 may be less than the number of TSVs 2500. Accordingly, a TSV 2500 having no corresponding third connecting members 2600 may be connected to a third connecting member 2600 already occupied by another TSV 2500, via the multi-layered wiring patterns.

Each of the third connecting members 2600 formed on the main chip 2000 may be larger than each of the first connecting members 140, because wiring having the main chip 2000 mounted thereon and formed on a board substrate is standardized or it is difficult to densify the wring due to the physical characteristics (for example, plastic) of the board substrate. For this reason, all of the TSVs 2500 may not correspond to all of the third connecting members 2600, respectively.

A chip-stacked semiconductor package according to the inventive concept measures detects a stacking accuracy between a first chip and a second chip, based on an overlapping area between a detection pad of the first chip and a detection pad of the second chip obtained due to a measured capacitance between the detection pad of the first chip and the detection pad of the second chip. Accordingly, the chip-stacked semiconductor package according to the inventive concept may detect the stacking accuracy on an in-line during a manufacturing process.

The chip-stacked semiconductor package according to the inventive concept detects a joint gap between the first chip and the second chip by measuring a capacitance between the detection pad of the first chip and the detection pad of the second chip. Accordingly, the chip-stacked semiconductor package according to the inventive concept may non-destructively measure and obtain the joint gap on an in-line during manufacturing.

While the inventive concept has been particularly shown and described with reference to embodiments thereof, it will be understood that various changes in form and details may be made therein without departing from the spirit and scope of the following claims.

What is claimed is:

1. A chip-stacked semiconductor package comprising:
    a first chip comprising a first detection pad and a second detection pad;
    a second chip provided on the first chip, the second chip comprising a third detection pad facing the first detection pad and a fourth detection pad facing the second detection pad; and
    a first medium provided between the first detection pad and the third detection pad to connect the first detection pad to the third detection pad through the first medium, and a second medium, different from the first medium, provided between the second detection pad and the fourth detection pad to connect the second detection pad to the fourth detection pad through the second medium.

2. The chip-stacked semiconductor package of claim 1, wherein the second detection pad is located adjacent to the first detection pad and the fourth detection pad is located adjacent to the third detection pad.

3. The chip-stacked semiconductor package of claim 1, wherein the first medium is a solder bump, and the second medium is an underfill or a sealant.

4. The chip-stacked semiconductor package of claim 1, wherein the third detection pad and the fourth detection pad are connected to each other via a conductive line in the second chip.

5. The chip-stacked semiconductor package of claim 1, wherein the first chip comprises:
    a chip region on which the first detection pad and the second detection pad are provided,
    a scribe lane region adjacent to the chip region, and
    a plurality of conductive lines formed on the scribe lane region configured to electrically connect the first detection pad and the second detection pad.

6. The chip-stacked semiconductor package of claim 1, wherein the first chip comprises:
    a chip region on which the first detection pad and the second detection pad are provided formed,
    a scribe lane region adjacent to the chip region,
    a first test terminal electrically connected to the first detection pad via a first conductive line formed on the scribe lane region, and
    a second test terminal electrically connected to the second detection pad via a second conductive line formed on the scribe lane region.

7. The chip-stacked semiconductor package of claim 1, wherein the first chip comprises:
    a plurality of first chip pads provided on an edge portion of the first chip, wherein a first one of the plurality of first chip pads is the first detection pad and a second one of the plurality of first chip pads is the second detection pad, and
    wherein the second chip comprises:
    a plurality of second chip pads provided on an edge portion of the second chip, wherein a first one of the plurality of second chip pads is the third detection pad and a second one of the plurality of second chip pads is the fourth detection pad.

8. The chip-stacked semiconductor package of claim 1, wherein the first chip comprises:
    a plurality of first chip pads provided on a center portion of the first chip, wherein a first one of the plurality of first chip pads is the first detection pad and a second one of the plurality of first chip pads is the second detection pad, and
    wherein the second chip comprises:
    a plurality of second chip pads provided on a center portion of the second chip, wherein a first one of the plurality of second chip pads is the third detection pad and a second one of the plurality of second chip pads is the fourth detection pad.

9. The chip-stacked semiconductor package of claim 1, wherein the first chip further comprises: a plurality of first chip pads, wherein respective planar sizes of the first detection pad and the second detection pad are greater than a planar size of each of the plurality of first chip pads, and
    wherein the second chip further comprises: a plurality of second chip pads, wherein respective planar sizes of the third detection pad and the fourth detection pad are greater than a planar size of each of the plurality of second chip pads.

10. The chip-stacked semiconductor package of claim 1, wherein a horizontally overlapping area between the second detection pad and the fourth detection pad indicates a stacking accuracy, and wherein the horizontally overlapping area between the second detection pad and the fourth detection pad is 39% to 100% of an area of the second detection pad or the fourth detection pad.

11. The chip-stacked semiconductor package of claim 1, wherein a joint gap between the first chip and the second chip is ½ to ⅔ of a reference joint gap between the second detection pad and the fourth detection pad.

12. A chip-stacked semiconductor package comprising:
    a first chip comprising a first detection pad, a second detection pad, a first test terminal and a second test terminal, the first test terminal electrically connected to the first detection pad and the second test terminal electrically connected to the second detection pad; and
    a second chip provided on the first chip with a gap therebetween and comprising a third detection pad facing the first detection pad and a fourth detection pad facing the second detection pad,
    wherein the third detection pad overlaps the first detection pad and is connected to the first detection pad through a medium, wherein the fourth detection pad is not connected to the second detection pad through the medium, wherein the fourth detection pad is electrically connected to the third detection pad via a conductive line, and wherein the first test terminal and the second test terminal are configured to measure a capacitance between the second detection pad and the fourth detection pad.

13. The chip-stacked semiconductor package of claim 12, wherein a planar shape of each of the first through fourth detection pads is a circle or a polygon.

14. The chip-stacked semiconductor package of claim 12, wherein the first detection pad and the second detection pad constitute a first detection pad group, and the first detection pad group comprises a first sub detection pad group and a second sub detection pad group separated from each other, and the third detection pad and the fourth detection pad constitute a second detection pad group, and the second detection pad group comprises a third sub detection pad group and a fourth sub detection pad group separated from each other.

15. The chip-stacked semiconductor package of claim 12, wherein the first chip comprises: a chip region on which the first detection pad and the second detection pad are provided, a scribe lane region adjacent to the chip region, and a plurality of conductive lines formed on the scribe lane region configured to electrically connect the first detection pad and the second detection pad.

16. The chip-stacked semiconductor package of claim 12, wherein a capacitance between the second detection pad and the fourth detection pad indicates a stacking accuracy based on a horizontally overlapping area between the second detection pad and the fourth detection pad, and the capacitance corresponding to the stacking accuracy is 39% to 100% of a reference capacitance.

17. The chip-stacked semiconductor package of claim 12, wherein a capacitance between the second detection pad and the fourth detection pad indicates a joint gap between the first chip and the second chip, and the capacitance corresponding to the joint gap is 67% to 200% of a reference capacitance.

18. A chip-stacked semiconductor package comprising:
a first chip comprising first connecting members respectively provided on one surface of each of through silicon vias and electrically connected to the through silicon vias, and first chip pads respectively on another surface of each of the through silicon vias and electrically connected to the through silicon vias;

a second chip on the first chip and comprising second connecting members electrically connected to the first chip pads, wherein the second connecting members comprise bumps and second chip pads; and a sealant configured to seal spaces between the second connecting members and the first chip pads between the first chip and the second chip, wherein a first one of the first chip pads forms a first detection pad and a second one of the first chip pads forms a second detection pad, wherein a first one of the second chip pads forms a third detection pad connected to the first detection pad, and a second one of the second chip pads forms a fourth detection pad, wherein the fourth detection pad is not connected to the second detection pad, and wherein the fourth detection pad is electrically connected to the third detection pad via a conductive line.

19. The chip-stacked semiconductor package of claim 18, wherein a bump is provided between the first detection pad and the third detection pad to electrically connect the first detection pad to the third detection pad via the bump, and wherein the sealant is provided between the fourth detection pad and the second detection pad.

20. The chip-stacked semiconductor package of claim 18, wherein the first connecting members are formed of test terminals electrically connected to the first detection pad and the second detection pad, and wherein the first connecting members are configured to measure a capacitance between the second detection pad and the fourth detection pad.

* * * * *